(12) United States Patent
Kim et al.

(10) Patent No.: US 11,302,846 B2
(45) Date of Patent: Apr. 12, 2022

(54) LIGHT EMITTING DEVICE PACKAGE AND LIGHT SOURCE UNIT

(71) Applicant: SUZHOU LEKIN SEMICONDUCTOR CO., LTD., Taicang (CN)

(72) Inventors: Min Sik Kim, Seoul (KR); Won Jung Kim, Seoul (KR); Ki Seok Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 162 days.

(21) Appl. No.: 16/539,421

(22) Filed: Aug. 13, 2019

(65) Prior Publication Data

US 2020/0058829 A1    Feb. 20, 2020

(30) Foreign Application Priority Data

Aug. 14, 2018    (KR) .......................... 10-2018-0095184

(51) Int. Cl.
| | |
|---|---|
| H01L 33/38 | (2010.01) |
| H01L 33/00 | (2010.01) |
| H01L 33/56 | (2010.01) |
| H01L 33/50 | (2010.01) |

(52) U.S. Cl.
CPC ........ *H01L 33/382* (2013.01); *H01L 33/0062* (2013.01); *H01L 33/0083* (2013.01); *H01L 33/504* (2013.01); *H01L 33/56* (2013.01)

(58) Field of Classification Search
CPC ..... H01L 33/382; H01L 33/56; H01L 33/483; H01L 33/52; H01L 33/54; H01L 33/504; H01L 33/0083; H01L 33/62; H01L 33/60; H01L 33/486
See application file for complete search history.

(56) References Cited

U.S. PATENT DOCUMENTS

| | | | | |
|---|---|---|---|---|
| 2002/0162687 A1* | 11/2002 | Akihiko | ................. | H05K 3/389 174/262 |
| 2008/0191227 A1* | 8/2008 | Kimura | ................... | H01L 33/62 257/98 |
| 2014/0332839 A1* | 11/2014 | Choi | ....................... | H01L 33/62 257/99 |
| 2018/0190879 A1* | 7/2018 | Yu | ...................... | C09K 11/0883 |
| 2021/0184090 A1* | 6/2021 | Kim | ..................... | H01L 33/486 |

* cited by examiner

*Primary Examiner* — Latanya N Crawford Eason
(74) *Attorney, Agent, or Firm* — Birch, Stewart, Kolasch & Birch, LLP

(57) ABSTRACT

A light emitting device package disclosed to an embodiment of the invention includes a body including an upper surface and a lower surface, the body including a first recess and a second recess concaved from the lower surface toward the upper surface; a light emitting device disposed on the body and including a first bonding portion and a second bonding portion; and first and second conductive portions respectively disposed in the first recess and the second recess, wherein the body includes a first through hole and a second through hole penetrating an upper surface of each of the first recess and the second recess and the upper surface of the body, and wherein each of the first and second conductive portions extends into the first and second through holes and is electrically connected to the first bonding portion and the second bonding portion, respectively.

20 Claims, 11 Drawing Sheets

LIGHT EMITTING DEVICE PACKAGE AND LIGHT SOURCE UNIT

The present application claims priority under 35 U.S.C. § 119(a) of Korean Patent Application No. 10-2018-0095184 filed on Aug. 14, 2018, which is hereby incorporated by reference in its entirety.

BACKGROUND

Embodiments of the present invention relate to a light emitting device package, a method of manufacturing a light emitting device package, and a light source device having the same. Embodiment of the present invention relates to a semiconductor device package, a method of manufacturing a semiconductor device package, and a light source unit having the same.

Semiconductor devices including compound semiconductors of Group III-V or Group II-VI have many advantages such as having wide and easy band gap energy and may be used variously in light emitting devices, light receiving devices and various diodes. The light emitting device such as a light emitting diode or a laser diode using a compound semiconductor material may realize light of various wavelength bands such as red, green, blue or ultraviolet rays. The light emitting device may emit white light by using a fluorescent material or combining a plurality of colors.

When the light receiving device such as a photodetector or a solar cell is fabricated using a Group III-VI or Group II-VI compound semiconducting material, since the material of the device material has been developed, light in various wavelength ranges is absorbed to generate optical current, so that light of various wavelength ranges from gamma rays to radio wavelength regions may be used. Further, such the light receiving device may have advantages of a fast response speed, safety, environmental friendliness and easy control of device materials, so that the light receiving device may be easily used for a power control, a microwave circuit or a communication module.

Accordingly, the semiconductor device is expanded to a transmission module of an optical communication means, a light emitting diode backlight serving as a substitute for a cold cathode fluorescent lamp (CCFL) constituting a backlight of an LCD (Liquid Crystal Display) display device, white light emitting diode (LED) lighting devices serving as a substitute for a fluorescent lamp or an incandescent lamp, an automotive headlights, an traffic lights, and gas and fire sensors. In addition, semiconductor devices may expanded to a high frequency application circuits, other power control devices, and communication modules.

The light emitting device may be provided as a p-n junction diode having a characteristic in which electric energy is converted into light energy by using a group III-V element or a group II-VI element in the periodic table, and may provide various wavelengths may be realized by adjusting the composition ratio. For example, nitride semiconductors have received great interest in the development of optical devices and high power electronic devices due to their high thermal stability and wide bandgap energy. Particularly, a blue light emitting device, a green light emitting device, an ultraviolet (UV) light emitting device, and a red (RED) light emitting device using a nitride semiconductor are commercially available and widely used. For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength. Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied. In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed. In addition, in the semiconductor device package, studies on a method for reducing the manufacturing cost and improving the manufacturing yield by improving the process efficiency and changing the structure have been performed.

SUMMARY

An embodiments of the present invention may provide a device package in which a through hole of a body is disposed under a semiconductor device or a light emitting device. An embodiments of the present invention may provide a device package in which a conductive portion in which a metal and a polymer are combined in a through hole of a body is disposed. An embodiment of the present invention provides a device package in which a conductive portion in which a metal and a resin are combined in a through hole of a body is disposed. An embodiment of the present invention provides a device package in which a conductive portion in which a metal and a thermosetting or photo-setting resin are combined with a through hole of a body is disposed. An embodiment of the present invention may provide a device package in which a conductive portion including a metal content of 50 wt % or more and a polymer resin of 10 wt % or more is arranged in a through hole of a body. An embodiment of the present invention may provide a device package in which a conductive portion including a metal content of 70 wt % or more and a polymer resin of 10 wt % or more is arranged in a through hole of a body. Embodiments of the present invention may provide a device package including a lower recess recessed in an upper surface direction from a lower surface of a body around through holes of a body.

Embodiments of the present invention may provide a device package in which each through hole of a body is connected to a lower recess, and a conductive portion is disposed in the through hole and the lower recess. An embodiment of the present invention may provide a device package having a metal portion on a surface of the through hole of the body and a conductive portion in the metal portion. An embodiment of the present invention may provide a device package including a metal portion disposed on a surface of a lower recess of a body, and a conductive portion disposed on the metal portion. Embodiments of the present invention may provide a device package in which a first resin is disposed between a body and a device, and may support and fix a bottom of the device. Embodiments of the invention may provide a device package in which one or more upper recesses are disposed on the upper body and a first resin is disposed on the upper recess.

Embodiments of the present invention may provide a semiconductor device package or a light emitting device package capable of improving light extraction efficiency and electrical characteristics. Embodiments of the present invention may provide a semiconductor device package or a light emitting device package that may improve process efficiency and improve manufacturing yield. Embodiments of the present invention may provide a device package capable of preventing a re-melting phenomenon from occurring in a bonding region of a device package in the process of re-bonding the device package to the substrate.

A light emitting device package according to an embodiment of the present invention comprises: a body including an upper surface and a lower surface, the body including a first recess and a second recess concaved from the lower surface toward the upper surface; a light emitting device disposed on the body and including a first bonding portion and a second bonding portion; and first and second conductive portions respectively disposed in the first recess and the second recess, wherein the body includes a first through hole and a second through hole penetrating an upper surface of each of the first recess and the second recess and the upper surface of the body, and wherein each of the first and second conductive portions extends into the first and second through holes and may be electrically connected to the first bonding portion and the second bonding portion, respectively.

According to an embodiment of the invention, wherein each of the first and second conductive portions comprise a resin and a metal, and wherein each of the first and second conductive portions have a wt % of the metal being higher than a wt % of the resin. The wt % of the metal in the each of the first and second conductive portions is a 70 wt % or more, and the wt % of the resin is a 10 wt % or more, and wherein the first and second conductive portions are in contact with a surface of the body in the first and second through holes. The resin of the first and second conductive portions comprises an amine-based resin adhesive or an epoxy-based resin adhesive. First and second metal portions is disposed in the first and second through holes, respectively, wherein the wt % of the metal in the first and second conductive portions is a 50 wt % or more, the wt % of the resin is a 25 wt % or more, and wherein the first and second conductive portions are not in contact with a surface of the body in the first and second through holes, respectively. The first metal portion is in contact with the first bonding portion disposed on an upper surface of the first through hole, and wherein the second metal portion is in contact with the second bonding portion disposed on an upper surface of the second through hole. The first and second metal portions is disposed in the first and second recesses, respectively, the first and second recesses are disposed on an outer side of the first and second through holes, respectively, extension portions of the first and second conductive portions are extended to the first and second recesses, respectively, and the first and second metal portions have a thickness smaller than a depth of the first and second recesses.

According to an embodiment of the invention, wherein the first through hole is disposed on a portion of the first recess, wherein the second through hole is disposed on a portion of the second recess, wherein extension portions of the first and second conductive portions are extended to the first and second recesses, wherein an area of a lower surface of the first through hole is smaller than an area of a lower surface of the first recess, and wherein an area of a lower surface of the second through hole is smaller than an area of a lower surface of the second recess.

According to an embodiment of the invention, wherein inner side surfaces of the first and second through holes include at least one protruding portion protruding toward a center of the first and second through holes, respectively. The at least one of a lower surface and a periphery of the light emitting device includes at least one of a resin and an upper recess.

A light emitting device package according to an embodiment of the present invention comprises: a body including an upper surface, a lower surface, and a cavity, the body including a first through hole and a second through hole penetrating from a bottom surface of the cavity toward the lower surface of the body; a light emitting device disposed in the cavity and including a first bonding portion and a second bonding portion; a first resin disposed in the cavity and adhered to the light emitting device; a first conductive portion disposed in the first through hole; and a second conductive portion disposed in the second through hole, wherein the body includes a first recess and a second recess concaved from the lower surface of the body toward the bottom surface of the cavity, wherein each of the first and second bonding portions is electrically connected to each of the first and second conductive portions, wherein each of the first and second conductive portions is exposed on the lower surface of the body, and wherein the first and second conductive portions comprise a resin and a metal.

According to an embodiment of the invention, wherein the first and second conductive portions have a wt % of the metal greater than a wt % of the resin, and wherein the first and second conductive portions are in contact with a surface of the body in the first and second through holes, respectively. The wt % of the metal in the first and second conductive portions is a 70 wt % or more, and the wt % of the resin is a 10 wt % or more, and the resin of the first and second conductive portions comprises an amine-based resin adhesive or an epoxy-based resin adhesive. The package comprises a first metal portion disposed on a surface of the first through hole; and a second metal portion disposed on a surface of the second through hole, wherein the first metal portion is disposed around the first conductive portion disposed in the first through hole, wherein the second metal portion is disposed around the second conductive portion disposed in the second through hole, wherein each of the first and second metal portions is in contact with the surfaces of the first and second through holes, respectively. Each of the first and second conductive portions are not in contact with the surfaces of the first and second through holes, respectively. The first metal portion is connected to the first bonding portion disposed on an upper surface of the first through hole, and wherein the second metal portion is connected to the second bonding portion disposed on an upper surface of the second through hole. A depth of the first and second recesses is smaller than a depth of the first and second through holes, wherein a lower portion of the first through hole is disposed on the first recess, and wherein a lower portion of the second through hole is disposed on the second recess.

A lighting source unit according to embodiment of present invention comprises: a circuit board including first and second pads; and one or a plurality of light emitting device packages are disposed on the pads of the circuit board, wherein the light emitting device package is the above light emitting device package.

DETAILED DESCRIPTION OF THE EMBODIMENTS

Figure 1:
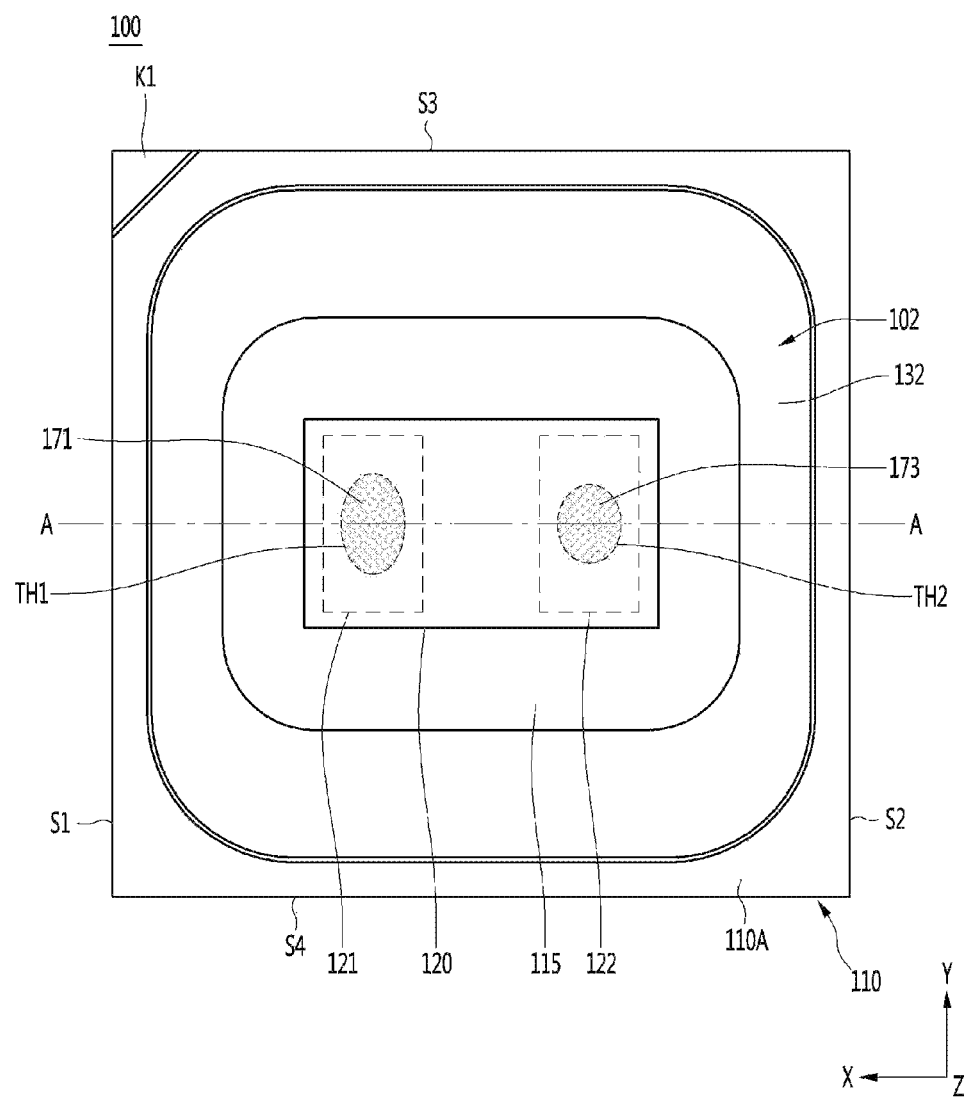
FIG. 1 is a plan view of a light emitting device package according to a first embodiment of the present invention.

Hereinafter, preferred embodiments of the present invention will be described in detail with reference to the accompanying drawings. The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, can be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and B, C is stated, it may include one or more of all combinations that may be combined with A, B, and C. In describing the components of the embodiments of the invention, terms such as first, second. A, B, (a), and (b) can be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected" "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Hereinafter, a semiconductor device package according to an embodiment of the present invention will be described in detail with reference to the accompanying drawings. The semiconductor device of the device package may include a light emitting device that emits light of an ultraviolet ray, an infrared ray, or a visible ray. Hereinafter, a case where a light emitting device is applied as an example of a semiconductor device will be described, and a package or a light source device to which the light emitting device is applied includes a non-light emitting device such as a Zener diode or a sensing device for sensing wavelength or heat. Hereinafter, a case where a light emitting device is applied as an example of a semiconductor device will be described, and a light emitting device package will be described in detail.

First Embodiment

Figure 2:
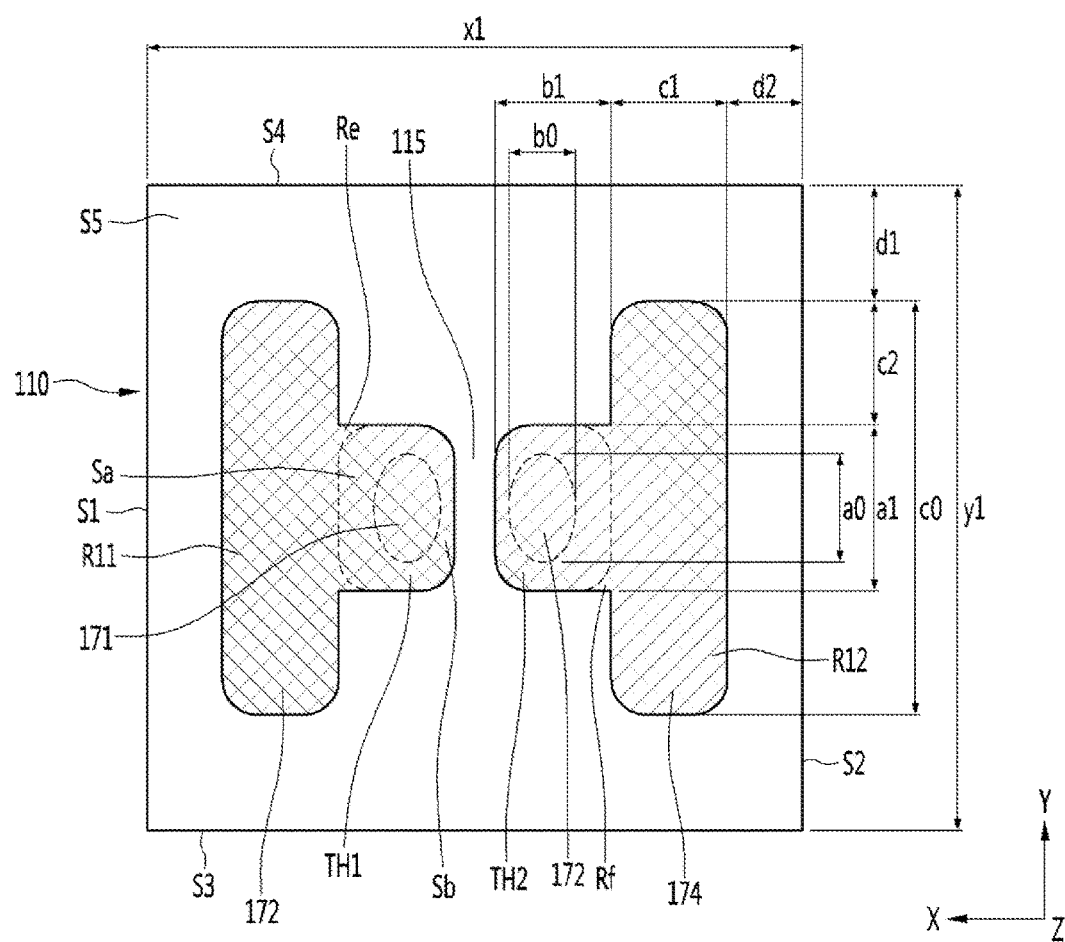
FIG. 2 is a bottom view of the light emitting device package of FIG. 1.
Figure 4:
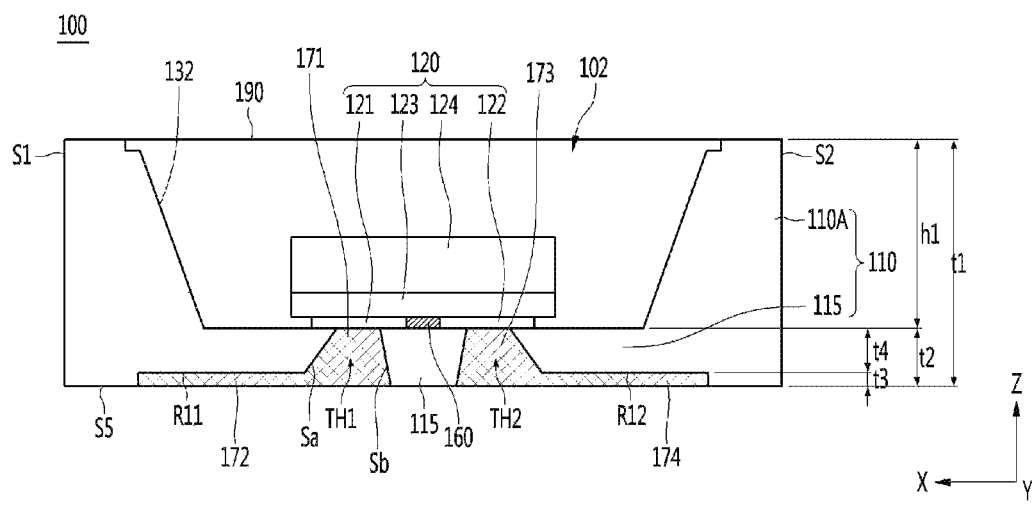
FIG. 4 is a cross-sectional view taken along a line A-A of the light emitting device package of FIG. 1.
Figure 5:
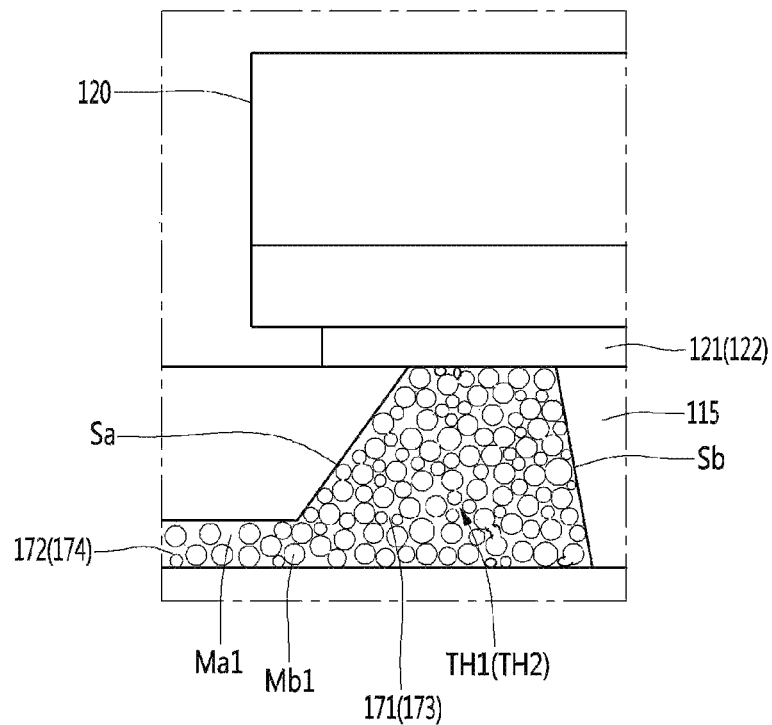
FIG. 5 is an enlarged view of a first through hole and a first conductive portion of the light emitting device package of FIG. 5.

FIG. 1 is a plan view of a light emitting device package according to a first embodiment of the present invention, FIG. 2 is a bottom view of the light emitting device package of FIG. 1, FIG. 4 is a cross-sectional view of taken along a line A-A of the light emitting device package of FIG. 1, and FIG. 5 is an enlarged view of the first through hole and the first conductive portion of the light emitting device package of FIG. 4.

As shown in FIGS. 1 to 5, the light emitting device package 100 may include a package body 110 and a light emitting device 120. The package body 110 may include a body 115 and an upper body 110A. The upper body 110A may be disposed on the body 115. The upper body 110A may be disposed around the upper portion of the body 115. The upper body 110A may provide a cavity 102 at an upper portion of the body 115. For example, the body 115 and the upper body 110A may be integrally formed. As another example, the body 115 and the upper body 110A may be formed separately from each other, and may be attached to or joined to each other. The body 115 and the upper body 110A may have a coupling structure such as a hook groove and/or a hook protrusion.

The body 115 may be a lower body or a supporting portion for supporting the light emitting device 120, and the upper body 110A may be a transmitting portion, a reflecting portion, or a side wall portion. The package body 110 does not include the upper body 110A that provides the cavity 102 and may be provided as a body 115 providing a flat upper surface. The upper body 110A is disposed around the light emitting device 120 and may reflect light emitted from the light emitting device 120 upward. The outer surface of the upper body 110A may be inclined with respect to the upper surface of the body 115.

The package body 110 may include the cavity 102. The cavity 102 may include a bottom surface and a side surface 132 that is inclined with respect to the top surface of the package body 110 on the bottom surface. The inclined side surface 132 may include one or more stepped steps. The package body 110 may be provided with a structure having the cavity 102, or may be provided with a flat structure without the cavity 102. As shown in FIG. 1, the upper body 110A of the package body 110 may be provided with an identification portion K1 for electrode identification.

For example, the package body 110 and/or the body 115 may be made of a resin material or an insulating resin material. The package body 110 may be formed of at least one selected from the group consisting of Polyphthalamide (PPA), Polychloro tri phenyl (PCT), liquid crystal polymer (LCP), polyamide 9T, silicone, epoxy, Epoxy molding compound (EMC), Silicon molding compound (SMC), ceramic, photo sensitive glass (PSG), or sapphire ($Al_2O_3$). The package body 110 or the body 115 may be formed of a resin material and may include a filler of a high refractive index material such as $TiO_2$ and $SiO_2$. The package body 110 or the body 115 may be formed of a thermoplastic resin. The upper body 110A may be made of the same material as the body 115. The package body 110 or the body 115 may be a reflective material or a transparent material. The package body 110 or the body 115 may be made of a transparent silicon material.

A length of the light emitting device package 100 in a first direction X may be equal to or greater than a length of a second direction Y. In the following description, the first direction is an X direction, the second direction is a Y direction orthogonal to the X direction, and a third direction may be a Z direction and the X direction orthogonal to the Y direction.

When the top view shape of the light emitting device 120 is a polygonal shape, the first direction may be a lengthwise long side of a sides of the light emitting device 120, or a direction in which the bonding portions are spaced apart. For example, the first direction may be a long side direction of the light emitting device 120, and the second direction may be a short side direction of the light emitting device 120. When the light emitting device 120 has a square shape, the sides of the first direction and the second direction may have the same length. Both the short sides of the light emitting device 120 may be disposed on opposite sides of the light emitting device 120 in the first direction and the opposite long sides of the light emitting device 120 may be disposed on the opposite sides of the light emitting device 120 in the second direction.

The package body 110 may include first and second side surfaces S1 and S2 disposed in the first direction, and third and fourth side surfaces S3 and S4 disposed in the second direction. The first and second side surfaces S1 and S2 may face each other with respect to the first direction of the package body 110. The third and fourth sides S3 and S4 may face each other with respect to the second direction of the package body 110. A distance between the first and second side surfaces S1 and S2 may be a length of the third and fourth sides S3 and S4 in the first direction. A distance between the third and fourth sides S3 and S4 may be a length of the first and second side surfaces S1 and S2 in the second direction. As shown in FIG. 2, a length x1 in the first direction and a length y1 in the second direction in the lower surface S5 of the body 115 may be the same or have a relationship of x1≥y1. The side surfaces S1, S2, S3, and S4 of the package body 110 may be perpendicular or inclined to the lower surface of the package body 110.

The package body 110 may be formed of an insulating material. The package body 110 may be provided on the upper surface or the bottom of the cavity 102 with a metal frame removed. Accordingly, the package body 110 may have a wider selection of body material than a structure having the metal frame. Since the package body 110 is not integrally formed with the metal frame, for example, the lead frame, a thickness of the metal portion in the package body 110 may be less than a thickness of the lead frame. Since the package body 110 may not be injected in advance with the lead frame, it may be easy to a design change of a position of a through hole in the package body 110, the shape of the cavity 102, a size of the package body 110, or the package size.

As shown in FIGS. 2 and 4, a thickness t1 of the package body 110 may be in the range of 100 μm or more, for example, 100 to 800 μm. The thickness t1 is a distance or an interval from the lower surface of the body 115 to the upper surface of the upper body 110A. The thickness t1 of the package body 110 may be a sum of a thickness t2 of the body 115 and a thickness of the upper body 110A. The thickness of the upper body 110A may be equal to or greater than a thickness of the light emitting device 120 and may be equal to the depth h1 of the cavity 102. The upper surface of the upper body 110A may be disposed at a position equal to or higher than the upper surface of the light emitting device 120 for light oriented angle distribution. In another example, when the upper body 110A is removed, the light oriented angle distribution of the light emitting device package may have a distribution of 130 degrees or more.

The package body 110 may include through holes TH1 and TH2. The package body 110 may have one or a plurality of through holes. The through holes TH1 and TH2 may be spaced apart in the first direction. The through holes TH1 and TH2 may include first and second through holes TH1 and TH2 that are spaced apart from each other. The first and second through holes TH1 and TH2 may penetrate the lower surface of the package body 110 disposed under the light emitting device 120. The body 115 may include through holes TH1 and TH2. The first and second through holes TH1 and TH2 may pass through the lower surface S5 from the upper surface of the body 115. The first and second through holes TH1 and TH2 may penetrate from the bottom of the cavity 102 to the lower surface S5 of the body 115. The first and second through holes TH1 and TH2 may pass through from the upper surface of the package body 110 or the body 115 in a downward direction or from the lower surface to the upper surface direction.

A width or area of an upper region of the first through hole TH1 may be smaller or equal to a width or area of a lower region of the first through hole TH1. A width or area of an upper region of the second through hole TH2 may be smaller or equal to a width or area of a lower region of the second through hole TH2. A width or the area of an upper surface of the first through hole TH1 may be different from an width or the area of a lower surface of the first through hole TH1. A width or area of an upper surface of the second through hole TH2 may be different from a width or the area of a lower surface of the second through hole TH2. The width or area of the upper surface of the first through hole TH1 may be smaller than the width or the area of the lower surface of the first through hole TH1. The width or area of the upper surface of the second through hole TH2 may be smaller than the width or area of the lower surface of the second through hole TH2.

An inner surfaces of the first and second through holes TH1 and TH2 may be provided in an inclined form in which the width gradually decreases from the lower region to the upper region. The inner surfaces of the first and second through holes TH1 and TH2 may be a vertical surface, or may include at least one or two or more of inclined surfaces or curved surfaces. As shown in FIG. 4, the inner surfaces of the first and second through holes TH1 and TH2 may include inclined surfaces.

Referring to FIG. 2, a center of the lower surface and a center of the upper surface of the first through hole TH1 may be disposed at a different position from each other. A center of the lower surface and a center of the upper surface of the second through hole TH2 may be disposed at a different position from each other. The distance between the center of the lower surface of the first through hole TH1 and the center of the lower surface of the second through hole TH2 in the first direction may be different from a distance between the centers of the upper surfaces of the first and second through holes TH1 and TH2. The distance between the centers of the lower surfaces of the first through holes TH1 and TH2 in the first direction may be greater than the distance between the centers of the upper surfaces of the first and second through holes TH1 and TH2. The center of the lower surface is moved in a direction of the first side surface S1 with respect to the center of the upper surface in the first through hole TH1, the center of the lower surface of the second through hole TH2 is moved in a direction of the second side surface S2 with respect to the center of the upper surface in the second through hole TH2. Two inner side surfaces Sa and Sb facing each other in the first and second through holes TH1 and TH2 may have different inclination angles. A surface of the first and second through holes TH1 and TH2 closest to both side surfaces of the package body 110 among the inner side surfaces Sa and Sb is referred to as a first side surface Sa, and a surface facing or facing the first inner side surface Sa will be described as the second inner surface Sb. The inclination angle is an external angle between an imaginary straight line extending from the upper edge to the lower edge of each of the inner side surfaces Sa and Sb and the lower surface of the body. The first inner side surface Sa may be disposed closer to the first side surface S1 or the third side surface S3 from the center of the body 115. The second inner side surface Sb may be disposed closer to the center of the body 115 than the first inner side surface Sa. Each of the first through hole TH1 and the second through hole TH2 may include first and second inner side surfaces Sa and Sb.

For example, an inclination angle of the first inner side surface Sa may be greater than an inclination angle of the second inner side surface Sb with respect to the lower surface of the first through hole TH1 in the first through hole TH1. For example, the inclination angle of the first inner side surface Sa may be provided greater than the inclination angle of the second inner side surface Sb with respect to a horizontal lower surface of the second through hole TH2 in the first through hole TH2. The inclination angle of the first and second inner side surfaces Sa and Sb may be an imaginary straight line extending from the upper end of each through hole to an lower end. In the first and second through holes TH1 and TH2, the first inner surface Sa may be a sloped surface, or a surface to which a vertical surface and an inclined surface are connected, or a concave surface. In the first and second through holes TH1 and TH2, the second inner side surface Sb may be a sloped surface, or a surface to which a vertical surface and an inclined surface are connected, or a concave surface. As another example, the second inner surface Sb may be when an upper portion is a vertical surface and a lower portion is a sloped surface in the first and second through holes TH1 and TH2, a height of the lower portion having the sloped surface may be greater than a height of the upper portion having the vertical surface in the first and second through holes TH1 and TH2. An upper end of the first inner side surface Sa and an upper end of the second inner side surface Sb may be curved or angled in the first and second through holes TH1 and TH2. Since the first inner side surface Sa of the first and second through holes TH1 and TH2 has a larger area than the second inner side surface Sb and is provided as an inclined surface, an adhesive strength with the resin material in the conductive portions 171 and 173 may be increased. The conductive portions 171 and 173 may be easily injected through the lower portions of the first and second through holes TH1 and TH2 and the contact area with the conductive portions 171 and 173 may be increased. Also, since the injection efficiency is increased, generation of voids in a region between the conductive portions 171 and 173 and the bonding portions 121 and 122 may be suppressed. The conductive portions 171 and 173 may be disposed in the through holes TH1 and TH2.

The distance between the first through hole TH1 and the second through hole TH2 at the lower surface region of the body 115 may be 100 µm to 600 µm. The distance between the first through hole TH1 and the second through hole TH2 at the lower surface region of the body 115 may be such that the light emitting device package 100 may prevent electrical interference when mounted on a circuit board or submount. The maximum depth of the first and the through holes TH1 and TH2 may be the same as the thickness t2 of the body 115. The depth of the first and second through holes TH1 and TH2 may be provided to a thickness that may maintain stable strength of the body 115. The depths of the first and second through holes TH1 and TH2 of the package body 110 may be 400 µm or less, for example, in a range of 80 to 400 µm or 100 to 300 µm. Here, the thickness t2 of the body 115 may be 400 µm or less, for example, in a range of 80 to 400 µm or 100 to 300 µm. The depth of the first and second through holes TH1 and TH2 of the body 115 may be equal to or thicker than the thickness of the body 115. The first and second through holes TH1 and TH2 may be disposed in a region overlapping a region of the light emitting device 120 in the vertical direction. The first and second through holes TH1 and TH2 may include at least one of a top, an ellipse, a polygonal shape, or an irregular shape having a straight line and a curved line. A lengths of the upper portion of the first and second through holes TH1 and TH2 may be provided with the same length in the first direction and the second direction or may be provided with a longer length in either one direction. The first and second through holes TH1 and TH2 may have the same length in the first direction and the second direction, or may have a longer length in either direction.

The first through holes TH1 may be disposed at one or plurality locations under the first bonding portion 121 of the light emitting device 120. The second through holes TH2 may be disposed at one or a plurality of locations under the second bonding portion 122 of the light emitting device 120. The first through holes TH1 face the first bonding portions 121 of the light emitting device 120 and may be arranged in the same number as the first bonding portions 121. The second through holes TH2 may face the second bonding portions 122 of the light emitting device 120 and may be arranged in the same number as the second bonding portions 122. The first and second through holes TH1 and TH2 may be the same or different from each other in the top shape and the bottom shape. Each of the first and second through holes TH1 and TH2 may be symmetrical in the upper shape and the lower shape. Each of the first and second through holes TH1 and TH2 may be asymmetrical in the top shape and the bottom shape. Each of the first and second through holes TH1 and TH2 may be disposed on the same vertical line or on different vertical straight line as centers of the upper shape and the center of the lower shape in at least one of the first direction and the second direction. For example, in the first and second through holes TH1 and TH2, the upper shape and the lower shape may have different shapes, or the centers of the upper portion and the lower portion may be disposed at different positions with respect to the first direction. In the first and second through holes TH1 and TH2, the upper shape and the lower shape may be different from each other, or a centers of the upper portion and the lower portion may be disposed at different positions with respect to the second direction.

Referring to FIGS. 1 and 4, the light emitting device 120 may include a first bonding portion 121, a second bonding portion 122, and a light emitting structure 123. The light emitting device 120 may include a substrate 124. The length of the light emitting device 120 in the first direction may be equal to or longer than the length of the second direction. The light emitting structure 123 may be disposed under the substrate 124. The light emitting structure 123 may be disposed between the substrate 124 and the first and second bonding portions 121 and 122. The light emitting structure 123 may include a first conductivity type semiconductor layer, a second conductivity type semiconductor layer, and an active layer disposed between the first conductivity type semiconductor layer and the second conductivity type semiconductor layer. The first bonding portion 121 may be electrically connected to the first conductivity type semiconductor layer. The second bonding portion 122 may be electrically connected to the second conductivity type semiconductor layer.

The substrate 124 is a light-transmitting layer, and may be formed of an insulating material or a semiconductor material. The substrate 124 may be selected from the group including, for example, a sapphire substrate ($Al_2O_3$), SiC, GaAs, GaN, ZnO, Si, GaP, InP and Ge. For example, the substrate 124 may be provided with a concave-convex pattern on its surface. The substrate 124 may be removed.

The light emitting structure 123 may be provided as a compound semiconductor. The light emitting structure 123 may be formed of, for example, a Group II-VI or Group III-V compound semiconductor. For example, the light emitting structure 123 may include at least two elements selected from aluminum (Al), gallium (Ga), indium (In), phosphorus (P), and arsenic (As). The first and second conductivity type semiconductor layers of the light emitting structure 123 may be formed of at least one of Group III-V or Group II-VI compound semiconductors. The first and second conductivity type semiconductor layers may be formed of a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group consisting of GaN, AlN, AlGaN, InGaN, InN, InAlGaN, AlInN, AlGaAs, GaP, GaAs, GaAsP, or AlGaInP. The first conductivity type semiconductor layer may be an n-type semiconductor layer doped with an n-type dopant such as Si, Ge, Sn, Se or Te. The second conductivity type semiconductor layer may be a p-type semiconductor layer doped with a p-type dopant such as Mg, Zn, Ca, Sr or Ba.

The active layer may be disposed between the first and second conductivity type semiconductor layers. The active layer may be formed of a compound semiconductor. The active layer may be implemented, for example, in at least one of Group III-V or Group V-VI compound semiconductors. When the active layer is implemented as a multi-well structure, the active layer may include a plurality of alternately arranged well layers and a plurality of barrier layers. In the case of $In_xAl_yGa_{1-x-y}N$ ($0 \leq x \leq 1$, $0 \leq y \leq 1$, $0 \leq x+y \leq 1$). For example, the active layer may include at least one selected from the group consisting of InGaN/GaN, GaN/AlGaN, AlGaN/AlGaN, InGaN/InGaN, InGaN/InGaN, AlGaAs/GaAs, InGaAs/GaAs, InGaP/GaP, AlInGaP/InGaP.

The light emitting device 120 may be disposed on the package body 110. The light emitting device 120 may be disposed on the body 115. The light emitting device 120 may be disposed in the cavity 102 provided by the package body 110. The first bonding portion 121 and the second bonding portion 122 may be spaced apart from each other on the lower surface of the light emitting device 120. The first bonding portion 121 may be disposed on the package body 110 or the body 115. The second bonding portion 122 may be disposed on the package body 110 or the body 115. The first and second bonding portions 121 and 122 may face the body 115. The first and second bonding portions 121 and 122 may be spaced apart from each other in the first direction. The first and second bonding portions 121 and 122 may be spaced apart from each other in the same direction as the first and second through holes TH1 and TH2.

The first and second bonding portions 121 and 122 may be electrodes or pads. The first and second bonding portions 121 and 122 are connected to the conductive portions 171 and 173 disposed in the first and second through holes TH1 and TH2 and may receive power. The light emitting device 120 may be driven by driving power supplied through the first bonding portion 121 and the second bonding portion 122. The light emitted from the light emitting device 120 may be extracted in an upper direction of the package body 110 or an upper direction of the upper body 110A. The light emitted from the light emitting device 120 may be reflected when the material of the body 115 and the upper body 110A of the package body 110 are reflective materials and may be transmitted when the material is a transparent material.

The first bonding portion 121 may be disposed between the light emitting structure 123 and the package body 110. The second bonding portion 122 may be disposed between the light emitting structure 123 and the package body 110. The first bonding portion 121 and the second bonding portion 122 may include at least one or both of a metal material and a non-metal material. The first and second bonding portions 121 and 122 may be formed of single or multi-layer using one or more materials or alloys selected from the group consisting of Ti, Al, In, Ir, Ta, Pd, Co, Cr, Mg, Zn, Ni, Si, Ge, Ag, Ag alloy, Au, Hf, Ru, Rh, ZnO, IrOx, RuOx, NiO, RuOx/ITO, Ni/IrOx/Au, Ni/IrOx/ITO.

The light emitting device 120 may include one or more light emitting cells. The light emitting cell may include at least one of an n-p junction, a p-n junction, an n-p-n junction, and a p-n-p junction. The plurality of light emitting cells may be connected in series in one light emitting device. Accordingly, the light emitting device 120 may have one or a plurality of light emitting cells, and when n light emitting cells are arranged in one light emitting device, the light emitting device 120 may be driven with a driving voltage of n times. For example, when the driving voltage of one light emitting cell is 3V and two light emitting cells are arranged in one light emitting device, each light emitting device may be driven with a driving voltage of 6V. Or when the driving voltage of one light emitting cell is 3V and three light emitting cells are arranged in one light emitting device, each light emitting device may be driven with a driving voltage of 9V. The number of light emitting cells arranged in the light emitting device 120 may be one or two to five.

A predetermined gap may be disposed at a region between the package body 110 or the body 115 and the light emitting device 120. A height of the gap may be equal to or greater than the thickness of the first and second bonding portions 121 and 122. The first resin 160 may be disposed in the gap. The first resin 160 may be disposed between a region between the first and second bonding portions 121 and 122 and disposed a region between the lower surface of the light emitting device 120 and the upper surface of the package body 110. The first resin 160 may be disposed on a region between the first and second bonding portions 121 and 122 and disposed a region between the lower surface of the light emitting device 120 and the upper surface of the body 115 or the bottom of the cavity 102. The first resin 160 may attach the light emitting device 120 to the package body 110. The first resin 160 may include a resin material such as silicone or epoxy. The first resin 160 may be made of a reflective resin. The first resin 160 may include a metal oxide or a filler therein. For example, the first resin 160 may be composed of a material containing a metal oxide or an impurity such as $TiO_2$, $SiO_2$, $Al_2O_3$, or the like. The first resin 160 may be dispensed on the lower portion of the light emitting device 120 before the conductive portions 171 and 173 are formed to attach and fix the light emitting device 120 on the body 115 have. Accordingly, it is possible to prevent the light emitting device 120 from flowing or tilting. The first resin 160 may fix the light emitting device 120 to the body 115 even if the conductive portions 171 and 173 are re-melted.

The first resin 160 may diffuse or reflect light between the light emitting device 120 and the package body 110 when light is emitted to the lower surface of the light emitting device 120. When the light is emitted to the lower surface of the light emitting device 120, the first resin 160 diffuses or reflects light and the light extraction efficiency of the light emitting device package may be improved.

Figure 3:
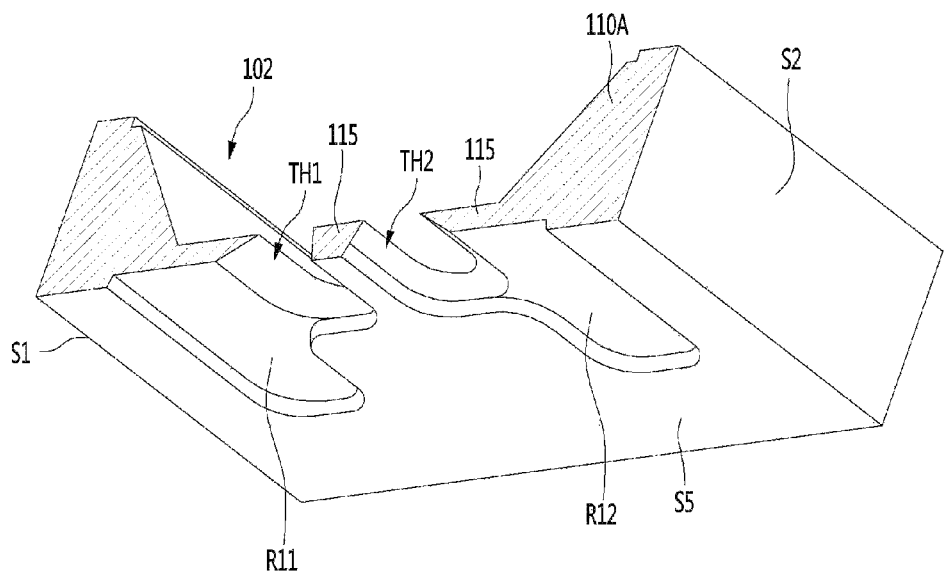
FIG. 3 is a perspective view showing a partial cross-sectional side view of a structure without a conductive portion in the light emitting device package of FIG. 1.
Figure 16:
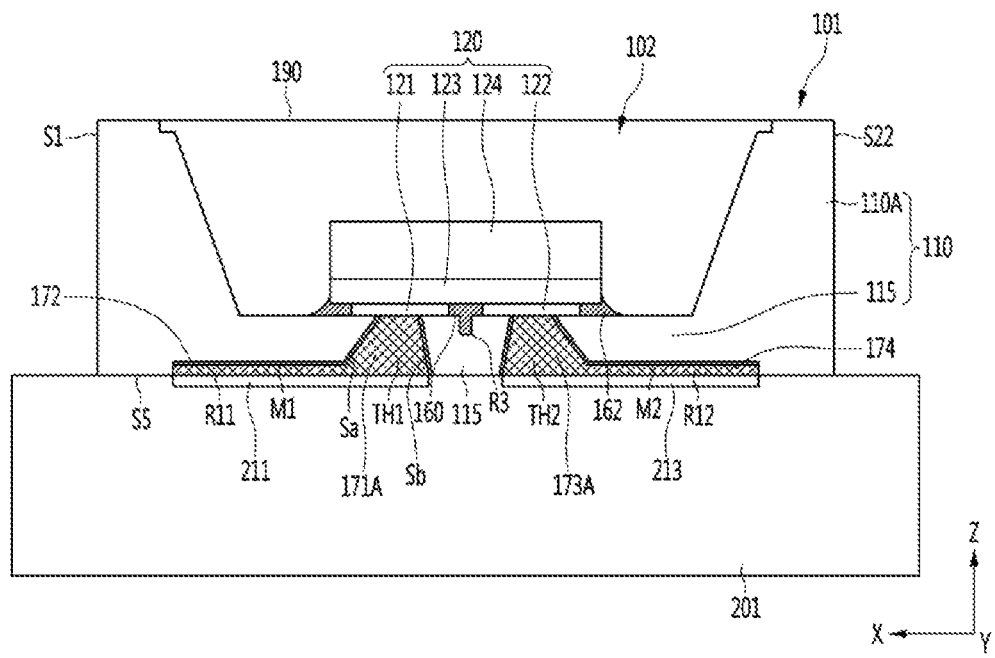
FIG. 16 is an example of a light source device having a light emitting device package according to the present embodiment.

The first resin 160 may be in contact with the lower surface of the light emitting device 120 and the package body 110. The first resin 160 may contact the lower surface of the light emitting device 120 and the upper surface of the body 115. The first resin 160 may be in contact with the first and second bonding portions 121 and 122. The first resin 160 may adhere the light emitting device 120 to the package body 110 to increase the supporting force of the light emitting device 120 and may prevent a tilting of the light emitting device 120. The first resin 160 may provide a stable fixing force between the light emitting device 120 and the package body 110. As shown in FIGS. 3 and 16, since the first resin 160 is attached to the lower surface of the light emitting device 120, when the conductive portions 171 and 173 which are bonded to the light emitting device 120 on the circuit board 201 may be re-melted, the first resin 160 may prevent the light emitting device 120 from moving and may support the light emitting device 120.

The first and second through holes TH1 and TH2 may be provided through the upper surface and the lower surface of the package body 110 in the Z direction. The first and second through holes TH1 and TH2 may overlap with the light emitting device 120 in the vertical direction Z. The first through hole TH1 may be disposed under the first bonding portion 121 of the light emitting device 120. The first through hole TH1 may be provided to overlap with the first bonding portion 121 of the light emitting device 120 in the vertical direction. The first through hole TH1 may be provided in a manner overlapping with the first bonding portion 121 of the light emitting device 120 in the Z direction toward the lower surface from the upper surface of the package body 110. Since the first bonding portion 121 is exposed through the first through hole TH1, an electrical path and dissipation path may be provided through of one or more types of a conductive materials filled or disposed in the first through hole TH1.

The second through hole TH2 may be disposed under the second bonding portion 122 of the light emitting device 120. The second through hole TH2 may overlap the light emitting device 120 in the vertical direction. The second through hole TH2 may be provided in a direction perpendicular to the second bonding portion 122 of the light emitting device 120. The second through hole TH2 may be provided to overlap the second bonding portion 122 of the light emitting device 120 in the direction from the upper surface to the lower surface of the package body 110. Since the second bonding portion 122 is exposed through the second through hole TH2, an electrical path and dissipation path may be provided through one or more types of conductive materials filled or disposed in the second through hole TH2.

Referring to FIG. 2, the first and second through holes TH1 and TH2 may have an upper width b0 in the first direction smaller than a lower width b1. The first and second through holes TH1 and TH2 may have an upper length a0 in the second direction smaller than a lower length a1. A ratio b1/b0 may be larger than a ratio a1/a0. In a contact efficiency between the first and second through holes TH1 and TH2 and the conductive portions 171 and 173, a contact efficiency in the first direction may be higher than a contact efficiency in the second direction, and a diffusion of the conductive portion in the first direction is induced by the structure of the through holes TH1 and TH2 and a diffusion of the conductive portion in the second direction may be suppressed by the structure of the through holes TH1 and TH2. The center of the upper surface and the center of the lower surface of the first through hole TH1 may be disposed at the same center or may be arranged to be shifted from each other. The center of the upper surface and the center of the lower surface of the second through hole TH2 may be disposed at the same center or may be arranged to be shifted from each other.

The distance between the lower centers of the first and second through holes TH1 and TH2 may be greater than the distance between the upper centers. Since the distance between the lower centers of the first and second through holes TH1 and TH2 is spaced apart from greater than the distance between the upper centers, the conductive portions 171 and 173 filled in the first and second through holes TH1 and TH2 are further spaced apart from the lower surface of the body 115.

The upper widths b0 and a0 and the upper lengths b1 and a1 of the first and second through holes TH1 and TH2 in the first and second directions may be smaller than a lower widths and a lower lengths of the first and second bonding portions 121 and 122 in the first and second directions. The width b0 of the upper region of the first through hole TH1 in the first direction may be smaller than or equal to the width of the first bonding portion 121. In addition, the width b0 of the upper region of the second through hole TH2 in the X direction may be smaller than or equal to the width of the second bonding portion 122. The widths of the first and second bonding portions 121 and 122 in the X direction may be the same or different from each other. The length a1 of the upper region of the first through hole TH1 in the second direction may be less than or equal to the length of the first bonding portion 121. The length a1 of the upper region of the second through hole TH2 in the Y direction may be smaller than or equal to the length of the second bonding portion 122. The lengths a1 of the first and second through holes TH1 and TH2 in the Y direction may be the same or different from each other. The lengths of the first and second bonding portions 121 and 122 in the Y direction may be the same or different from each other. For example, a lower surface area of the first bonding portion 121 may be larger than an upper surface area of the first through hole TH1. A lower surface area of the second bonding portion 122 may be larger than an upper surface area of the second through hole TH2.

The body 115 may include recesses R11 and R12 on the lower surface S5. The recesses R11 and R12 may be disposed around the through holes TH1 and TH2. The recesses R11 and R12 may be disposed in regions spaced apart from each other. The recesses R11 and R12 may be recessed in the upper surface of the body 115 from the lower surface S5 of the body 115. The recesses R11 and R12 may include a first recess R11 disposed in the periphery of the first through hole TH1 and a second recess R11 disposed in the periphery of the second through hole TH2. The first recess may be connected to the lower portion of the first through hole TH1 and may have a depth smaller than a depth of the first through hole TH1. The second recess R12 may be connected to the lower portion of the second through hole TH2 and may have a depth smaller than a depth of the second through hole TH2. A portion of the first recess R11 may be disposed between the first through hole TH1 and the first side surface S1 of the body 115. A portion of the second recess R12 may be disposed between the second through hole TH2 and the second side surface S2 of the body 115. The lower surface area of the first recess R11 may be larger than the lower surface area of the first through hole TH1. The lower surface area of the second recess R12 may be larger than the lower surface area of the second through hole TH2. The first and second recesses R11 and R12 may be provided in a space in which an extension portions 172 and 174 of the conductive portions 171 and 173 to be injected into the first and second through holes TH1 and TH2 are accommodated and may be provided with a depth for the minimum thickness of the extension portions 172 and 174. In the absence of the first recess R11 and the second recess R12, a thickness of the conductive portions 171 and 173 disposed on the lower surface of the body may be thin. As a result, the conductive portions 171 and 173 may cause in cracking or degraded electrical conduction efficiency. Accordingly, by connecting the recesses R11 and R12 to the through holes TH1 and TH2 of the body 115, the filling areas of the conductive portions 171 and 173 are increased, and a thickness of the conductive portion on the lower surface of the body may be increased. As a result, the area of the conductive portions 171 and 173 may be increased under the through holes TH1 and TH2, and the light emitting device package may be stably mounted on the circuit board.

Referring to FIG. 4, a depth t3 of the recesses R11 and R12 is a distance from the lower surface S5 of the body to the upper surface of the recesses R11 and R12, 120 μm or less, for example, in a range of 80 to 120 μm. The depth t3 of the recesses R11 and R12 may be less than 50% of the thickness of the body. When the depth t3 of the recesses R11 and R12 is smaller than the above range, cracks and adhesion may be reduced at the conductive portions 171 and 173, and when the depth t3 is greater than the above range, a stiffness of the body 115 located on the recesses R11 and R12 may be reduced. The thickness t2 of the body 115 disposed between the first and second through holes TH1 and TH2 is greater than the thickness t4 from the upper surface of the recesses R11 and R12 to the upper surface of the body.

The thickness t4 between the upper surface of the recesses R11 and R12 and the upper surface of the body may be equal to or larger than a half of the thickness t2 of the body 115. An upper thickness t4 of the body 115 on the recesses R11 and R12 may be in the range of 130 μm or more, for example, in a range of 130 to 200 μm. When the upper thickness t4 of the body 115 is smaller than the above range, a rigidity may be deteriorated. When the thickness t4 is larger than the above range, the thickness of the package may increase. The depth t3 of the recesses R11 and R12 may be equal to or smaller than the upper thickness t4 of the body 115. The depth t3 of the recesses R11 and R12 may be in a range of 20% to 50% of the upper thickness t4 of the body 115.

As shown in FIG. 2, the first recess R11 may include a first extension recess Re extending from the first through hole TH1 toward the first side surface S1. The second recess R12 includes a second extension recess Rf extending or connected from the second through hole TH2 toward the second side surface S2. The first extension recess Re may be overlapped with the lower region of the first through hole TH1 in the first direction. The second elongated recess Rf may overlap the lower region of the second through hole TH2 in the first direction. The first extension recess Re may be connected to a lower portion of the first through hole TH1 in one or more regions around the lower portion of the first through hole TH1. The second extension recess Rf may be connected to a lower portion of the second through hole TH2 in one or more regions around the lower portion of the second through hole TH2. For example, the maximum width a1 and b1 in the horizontal direction of each of the first and second through holes TH1 and TH2 may be smaller than the maximum width c0 and c1 in the horizontal direction of the first and second recesses R11 and R12. The first and second through holes TH1 and TH2 may be disposed between the first and second recesses R11 and R12.

In the first direction, the width c1 of the first and second recesses R11 and R12 may be great than the upper width b0 and be greater than or equal to the lower width b1 of the first and second through holes TH1 and TH2. In the second direction, the length c0 of the first recess R11 may be greater than or equal to the lower length a1 of the first through hole TH1. In the second direction, the length c0 of the second recess R12 may be greater than or equal to the lower length of the second through hole TH2. In the second direction, the length c0 of the first and second recesses R11 and R12 is at least one times the length a1 of the first and second through holes TH1 and TH2, for example, 1 times to 4 times. The first and second recesses R11 and R12 may have a larger length c0 (c0>c1) in the second direction c1 than a width c1 in the first direction. The centers of the first and second recesses R11 and R12 in the first and second directions may be disposed on a straight line that is the same as the center of the lower surface of the first and second through holes TH1 and TH2.

The first recess R11 may be spaced apart from the first side surface S1, third and fourth side surfaces S3 and S4 of the body 115. A distance d2 between the first recess R11 and the first side surface S1 of the body 115 may be smaller than a distance d1 between the first recess R11 and the third side surface S3 or the fourth side surface S4. The second recess R12 may be spaced from the second side surface S2, third and fourth side surfaces S3 and S4 of the body 115. A distance d2 between the second recess R12 and the second side surface S2 of the body 115 may be smaller than a distance d1 between the second recess R12 and the third side surface S3 or the fourth side surface S4.

Each of the lower surface areas of the first and second recesses R11 and R12 may be greater than each of the lower surface areas of the first and second through holes TH1 and TH2. The sum of the lower surface areas of the first and second recesses R11 and R12 may be disposed to be 80% or less, for example, in a range of 20% to 80% of the bottom surface area of the body 115. Accordingly, a reduction of the rigidity of the lower portion of the body 115 may be prevented, and the thickness of the conductive portion may be secured.

The first and second recesses R11 and R12 may overlap the light emitting device 120 in a vertical direction. The first and second recesses R11 and R12 may overlap with the side surface 132 of the cavity 102 of the body 115 in the vertical direction. Since the first and second recesses R11 and R12 are overlapped with the side surface 132 of the cavity 115 of the body 115 in the vertical direction, a rigidity of the body 115 in a region of the first and second recesses R11 and R12 overlapping with a side surface of the cavity may be prevented from being lowered. The depth t3 of the first and second recesses R11 and R12 overlapping in the vertical direction to the bottom of the cavity 102 and the depth t3 of the second recesses R11 and R12 overlapping in the vertical direction to the side surface 132 of the cavity may be equal to each other or the depth of the first and second recesses R11 and R12 overlapping the side surface of the cavity may be deeper.

As shown FIGS. 1, 2 and 4, the light emitting device package or light source device according to the embodiment of the present invention may include the conductive portions 171 and 173 in the first and second through holes TH1 and TH2. The conductive portions 171 and 173 may be disposed in the first and second through holes TH1 and TH2. The conductive portions 171 and 173 may include a polymer paste material. The conductive portions 171 and 173 may include a resin material adhered to a surface of the body 115. The resin material of the conductive portions 171 and 173 may include an epoxy-based thermosetting resin and/or photo curing resin material. Referring to FIG. 5, the first and second conductive portions 171 and 173 are connected to each other in a state where metal particles or metal linkers are densely packed in the through holes TH1 and TH2, so that the resin-based adhesive Ma1 and the metal particles or metal linkers Mb1 are mixed with each other. The conductive portions 171 and 173 may include a mixture of resin and metal. The mixture may have a weight percent of the metal based on a total weight of the resin than a weight percent of the resin. The conductive portions 171 and 173 may have a weight % of the metal greater than that of the resin, for example, at least 2 times or at least 2.3 times. The conductive portions 171 and 173 may have a weight % of the metal of 70 wt % or more based on the total weight. The conductive portions 171 and 173 may have a weight % of the metal ranging from 70 wt % to 90 wt % based on the total weight. When the weight percentage of the metal in the conductive portions 171 and 173 is less than the above range, the curing may be deteriorated. When the weight percentage is larger than the above range, the adhesion to the body 115 may be deteriorated. These conductive portions 171 and 173 may be provided as a metal paste having a weight percentage of the metal.

The weight percentage of the epoxy-based resin in the conductive portions 171 and 173 may be 10 wt % or more or 10 wt % to 30 wt % based on the total weight. When the weight percentage of the epoxy-based resin is less than the above range, the adhesion to the body may be deteriorated. When the weight percentage is larger than the above range, an electrical conductivity of the conductive portion may be deteriorated. The conductive portions 171 and 173 may have weight percentages of the resin less than weight percent of the metal, for example, 0.5 times or less or 0.4 times or less. According to an embodiment of the present invention, the conductive portions 171 and 173 may include 10 wt % or more of resin based on the total weight. For example, the epoxy-based resin in the conductive portions 171 and 173 may be in a range of 10 wt % to 30 wt %. Such a resin may be bonded to the body 115 made of a resin material. When the weight percentage of the resin in the conductive portions 171 and 173 is smaller than the above range, the contact area with the body may be reduced, and the conductive portion may be caused to flow or be detached to lower the electrical reliability. When the weight percent of the resin in the conductive portions 171 and 173 is larger than the above range, the weight percent of the metal may be increased, thereby deteriorating electrical characteristics and heat dissipation characteristics. The resin in the conductive portions 171 and 173 may support metal particles or metal links by pressing them by performing heat curing after printing the metal paste. At this time, the metal particles and the metal links are connected to each other, and the resin may be filled in a region between the metal particles or the metal links connected to each other or outside. The metal may include at least one of gold (Au), silver (Ag), and copper (Cu). The metal may be provided as a single or double structure of gold (Au), silver (Ag), or copper (Cu). In the case of the double structure, a structure may be a first metal and a second metal surrounding the first metal. The first and second metals may be any one of gold (Au), silver (Ag), and copper (Cu), and may include different metals. The first metal/second metal may include at least one of, for example, a structure of an Ag/Cu structure, a Cu/Ag structure, an Au/Cu structure, and a Cu/Au structure. Since the second metal is provided in a form to surround the first metal, it may be an anti-oxidation metal.

Figure 8:
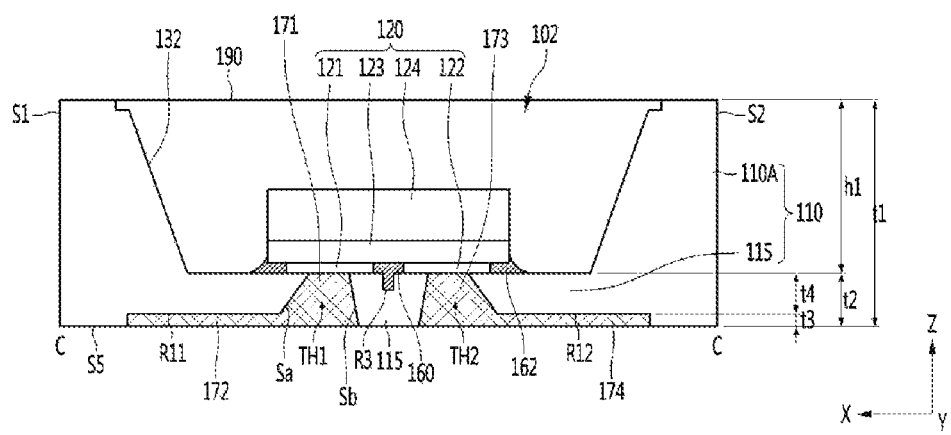
FIG. 8 is a cross-sectional view taken along a line B-B of the light emitting device package of FIG. 7.
Figure 11:
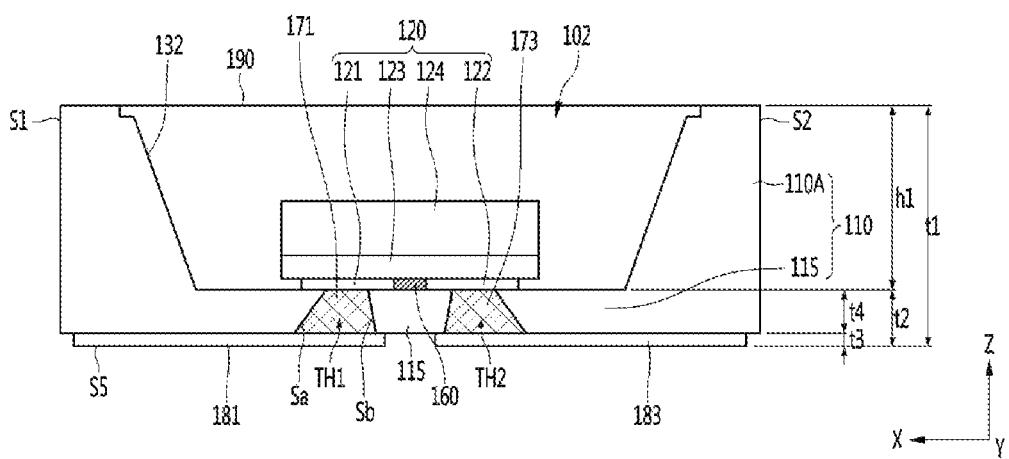
FIG. 11 is a side sectional view of the light emitting device package according to the second embodiment.

The package structure of FIGS. 4, 8, and 11 has a structure in which no metal is formed on the surface of the body 115, and the conductive portions 171 and 173 may be in direct contact with the surface of the body 115. In this structure, the material of the conductive portions 171 and 173 may include a paste material having good adhesion to the body. For example, the conductive portions 171 and 173 may be 70 wt % or more and 70 wt % or 90 wt %, respectively, based on the total weight of the metal. When the weight percent of the metal in the conductive portions 171 and 173 is less than the above range, the curing may be deteriorated. When the weight percent is larger than the above range, the adhesion to the body 115 may be deteriorated. These conductive portions 171 and 173 may be provided as a metal paste having a weight percent of the metal. The weight percent of the resin in the conductive portions 171 and 173 may be smaller than the weight percent of the metal, and may be, for example, 0.5 times or less or 0.4 times or less. The conductive portions 171 and 173 may include 10 wt % or more of resin based on the total weight. For example, the epoxy-based resin in the conductive portions 171 and 173 may be in a range of 10 wt % to 30 wt %. Such a resin may improve the adhesive force of the resin material to the body 115. When the weight percent of the resin in the conductive portions 171 and 173 is smaller than the above range, the contact area with the body 115 may be reduced, and the conductive portions 171 and 173 may be flowed or separated to deteriorate electrical reliability. The embodiment of the present invention may provide a metal paste in which the metal material of the conductive portions 171 and 173 is not a material such as tin (Sn) or flux, but a resin-based adhesive and metal are mixed. Such a resin-based adhesive may support or fix the metal in the through hole. In the conductive portions 171 and 173, the resin-based adhesive may be epoxy-based, synthetic epoxy-based, or thermosetting or photo-curable resin.

Since the conductive portions 171 and 173 include an epoxy resin material, when the flux or solder is added to a material such as Ag paste or Cu paste, a problem of non-contact with the resin may be solved. A material such as a solder paste has a characteristic that it is not in contact with a material of the body, and there is a problem that the material is difficult to electrical connection or heat dissipation. The epoxy-based resin material of the conductive portions 171 and 173 serves as a binder of the metals in the conductive portions 171 and 173. The conductive portions 171 and 173 may include a binder paste. Since the epoxy-based resin adhesive is added to the conductive portions 171 and 173, the conductive portions 171 and 173 may be bonded to a metal or a resin such as a body material.

The first conductive portion 171 may be disposed in the first through hole TH1 and the first extended portion 172 of the first conductive portion 171 may be disposed in the first recess R11. The top surface area of the first conductive portion 171 disposed in the first through hole TH1 may be smaller than the bottom surface area thereof. The lower surface of the first conductive portion 171 may be a horizontal surface such as a lower surface of the body 115 or a lower surface of the package body 110, or may be a stepped structure with respect to the lower surface of the body 115 or the lower surface of the package body 110.

The second conductive portion 173 may be disposed in the second through hole TH2 and the second extended portion 174 of the second conductive portion 173 may be disposed in the second recess R12. The top surface area of the second conductive portion 173 disposed in the second through hole TH2 may be smaller than the bottom surface area thereof. The lower surface of the second conductive portion 173 may be a horizontal surface such as the lower surface of the body 115 or the lower surface of the package body 110, or may be a stepped structure with respect to the lower surface of the body 115 or the lower surface of the package body 110. The lower surfaces of the first and second conductive portions 171 and 173 and the first and second extended portions 172 and 174 may be offset from the lower surface of the body 115 in the direction of the top surface of the body. Such the resin-based adhesive is hardened while compressing the metal paste at the time of thermal curing, so that the resin-based adhesive may support the metal particles or the metal and the links therebetween.

The first and second conductive portions 171 and 173 may be spaced apart from each other. A thickness of the first conductive portion 171 disposed in the first through hole TH1 may be greater than a thickness of the first conductive portion 171 disposed in the first recess R11. A thickness of the second conductive portion 173 disposed in the second through hole TH2 may be greater than a thickness of the second conductive portion 173 disposed in the second recess R12. An areas of the first and second extending portions 172 and 174 of the first and second conductive portions 171 and 173 extended to the first and second recesses R11 and R12 may be increased, an expanding of the first and second conductive portions 171, 173 at the lower portion of the body may be suppressed, and the thickness of the first and second extending portions 172 and 174 of the first and second conductive portions 171 and 173 in the recesses R11 and R12 may be secured.

The conductive portions 171 and 173 may be connected to the bonding portions 121 and 122, respectively. The first conductive portion 171 may be in contact with the lower surface of the first bonding portion 121. The second conductive portion 173 may be in contact with the lower surface of the second bonding portion 122. The contact area between a metal of the conductive portions 171 and 173 and the lower surface area of the bonding portions 121 and 122 may be smaller than the upper surface area of the through holes TH1 and TH2. The metal and resin of the conductive portions 171 and 172 may be in contact with the lower surfaces of the bonding portions 121 and 122. Each of contact areas between the metal of the first and second conductive portions 171 and 173 and the first and second bonding portions 121 and 122 may be greater than each of a contact areas between the resin of the first and second conductive portions 171 and 173 and the first and second bonding portions 121 and 122, for example, two times or more. The first and second conductive portions 171 and 173 may provide an electrically connection path and provide a heat radiation path to the first and second bonding portions 121 and 123 and the pads of the circuit board by each of the contact areas between the metal of the first and second conductive portions 171 and 173 and the first and second bonding portions 121 and 122.

Figure 6:
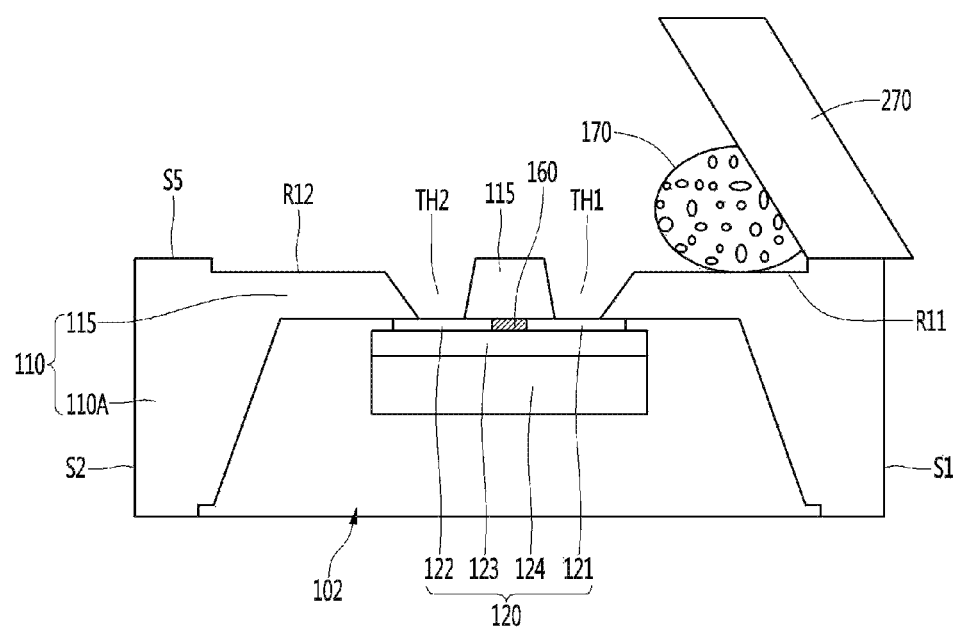
FIG. 6 is a view illustrating a process of forming a conductive portion of the light emitting device package of FIG. 4.

As shown in FIG. 6, the light emitting device 120 is attached to the bottom of the cavity through the first resin 160, and then the metal paste 170 may be a screen printing using a squeeze device 270. As shown in FIG. 4, the first and second through holes TH1 and TH2 and the first and second recesses R11 and R12 may be filled with the metal paste 170. Since the metal paste 170 is provided as a mixture of a liquid resin-based adhesive and a metal, the metal paste 170 may be bonded to the body surface disposed on the surfaces of the through holes TH1 and TH2. Thereafter, the metal paste 170 is cured through a thermal curing process. Through the thermal curing process, a bonding force between the resin and the metal of the metal paste may be enhanced. When such a metal paste is cured, it may be provided as a conductive portion.

The process of forming the molding part in the light emitting device 120 may be performed after the metal paste 170 is formed or before the printing process of the metal paste 170. As another example, the metal paste may be sprayed and cured to the respective through holes and the recess in a spray manner.

Referring to FIG. 4, the bonding portions 121 and 122 of the light emitting device 120 may be formed of an intermetallic compound (IMC) layer between the conductive portions 171 and 173 and the bonding portions 121 and 122, between the conductive portions 171 and 173 and the pad of the circuit board, or between the conductive portions 171 and 173, by a process a material constituting the conductive portions 171 and 173 and a forming the conductive portions 171 and 173 or a process of a heat treatment process after the conductive portions 171 and 173 are provided. For example, an alloy layer may be formed by combination between the material constituting the conductive portions 171 and 173 and the metals of the bonding portions 121 and 122 or the pads 211 and 213. Accordingly, the conductive portions 171 and 173 and the bonding portions 121 and 122 or the pads 211 and 213 may be physically and electrically stably coupled. The conductive portions 171 and 173 and the alloy layer may be physically and electrically stably coupled. The alloy layer may include the intermetallic compound layer. The intermetallic compound layer is formed by first material and second material, the first material may be provided from the conductive portions 171 and 173 and the second material may be provided from the bonding portions 121 and 122 or the pads 211 and 213.

The embodiment does not require the package body 110 to be exposed to high temperatures in the process of manufacturing the light emitting device package. Therefore, it is possible to prevent damage or discoloration of the package body 110 from being exposed to high temperature. Accordingly, the selection range for the materials constituting the upper body may be widened. The body 115 may be provided using a relatively inexpensive resin material as well as an expensive material such as ceramics.

The light emitting device package 100 may include a molding part 190. The molding part 190 may be provided on the light emitting device 120. The molding part 190 may be disposed on the package body 110. The molding part 190 may be disposed in the cavity 102 provided by the upper body 110A. The molding part 190 may include an insulating material. The molding part 190 may include a transparent material. The molding part 190 may include wavelength conversion means for receiving light emitted from the light emitting device 120 and providing wavelength-converted light. For example, the molding part 190 may include at least one selected from the group including phosphors, quantum dots, and the like. The light emitting device 120 may emit light of blue, green, red, white, infrared, or ultraviolet light. The phosphor or quantum dot may emit blue, green and red light. The molding part 190 may not be formed.

The phosphor disposed to an inner portion or a lower portion of the molding part 190 may include a phosphor material of a fluoride compound and may include at least one of an MGF-based phosphor material, a KSF-based phosphor material, and a KTF-based phosphor material. The phosphors may emit different peak wavelengths and emit light emitted from the light emitting devices to different yellow and red or different red peak wavelengths. One of the phosphors may include a red phosphor. The red phosphor may have a wavelength range of 610 nm to 650 nm, and the wavelength may have a half width of less than 10 nm. The red phosphor may include a fluoride-based phosphor. The fluorite-based fluorescent material may include at least one of KSF-based red $K_2SiF_6:Mn^{4+}$, $K_2TiF_6:Mn^{4+}$, $NaYF_4:Mn^{4+}$, $NaGdF_4:Mn^{4+}$, $K_3SiF_7:Mn^{4+}$. A KSF-based phosphor such as $KaS_{11-c}F_b:Mn^{4+}{}_c$, where a is 1≤a≤2.5, b is 5≤b≤6.5, and c is 0.001≤c≤0.1. In addition, the fluoride red phosphor may further include an organic coating on the fluoride coated surface, which is coated with a fluoride containing no Mn or a fluoride coated surface, respectively, in order to improve reliability at high temperature and high humidity. Unlike the general phosphor, the fluorite red phosphor has a narrow half width of 10 nm or less, and thus may be used in a high-resolution device.

The composition of the phosphor according to the embodiment should basically correspond to a stoichiometry, and each element may be substituted with another element in each group on the periodic table. For example, Sr may be substituted with Ba, Ca, Mg, etc. of an alkaline earth (II) group, and Y may be substituted with lanthanide series Tb, Lu, Sc, Gd and the like. In addition, Eu, which is an activator, may be substituted with Ce, Tb, Pr, Er, Yb or the like according to a desired energy level, and a negative activator may be further applied to the activator may be further to the activator alone or to modify its characteristics. The quantum dot may include an II-VI compound or a III-V compound semiconductor, and may emit red light. The quantum dot include, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, S1, $CuInS_2$, $CuInSe_2$ and the like, and combinations thereof.

Figure 15:
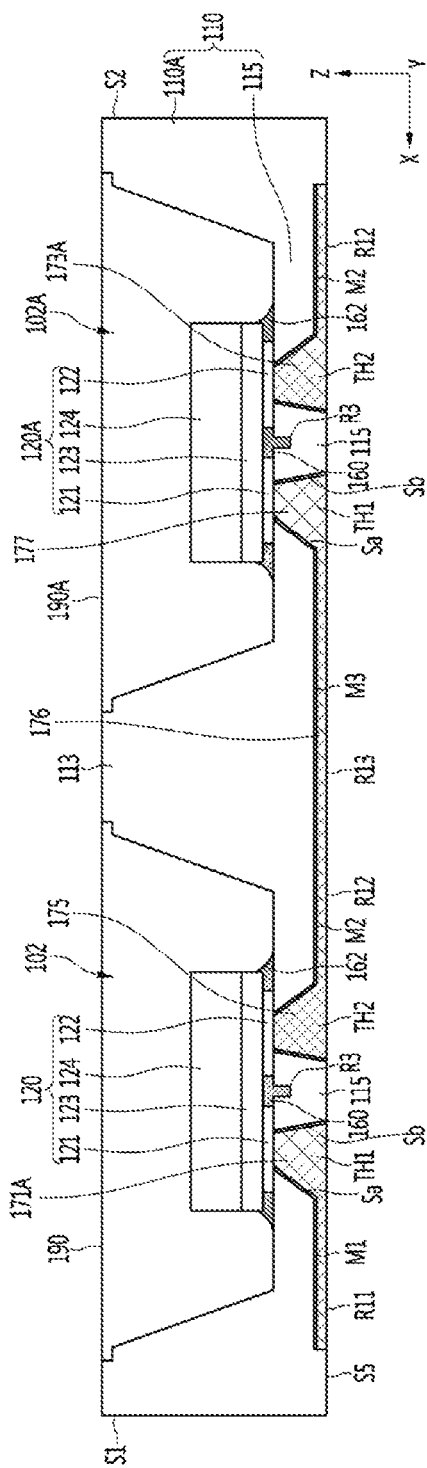
FIG. 15 is another example of the light emitting device package according to this embodiment.

A wavelength conversion layer (not shown) may be disposed on the molding part 190. The wavelength conversion layer may include a phosphor. The molding part 190 may be a resin layer without a phosphor. The wavelength conversion layer may extend on the upper surface of the package body 110. A side surface of the wavelength conversion layer may be disposed in a vertical plane, such as the side surface of the body 115 or the side surface of the package body 110. The upper surface area of the wavelength conversion layer may be the same as the lower surface area of the body 115. The phosphor added to the wavelength conversion layer may include at least one of blue, green, red, and yellow phosphors. Since such a structure is cut in units of a unit package after the molding part or the wavelength conversion layer is formed, the side surface of the body 115 and the side surface of the wavelength conversion layer may be arranged on the same plane. In addition, the size of the unit package may be selectively adjusted. In addition, as shown in FIG. 15, two or more light emitting device packages may be connected in series, or may be cut into a package size that may be connected in a serial-parallel or parallel manner.

Figure 7:
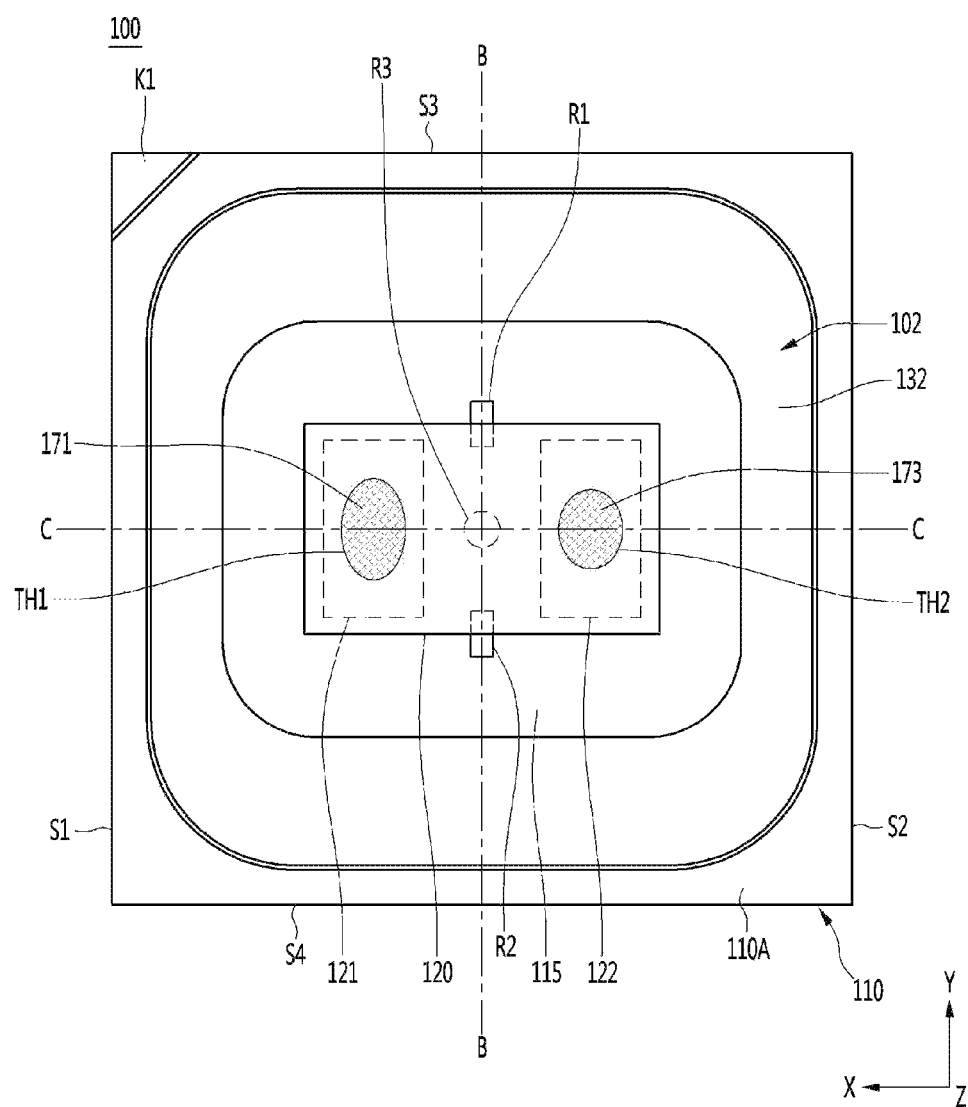
FIG. 7 is another example of the light emitting device package of FIG. 1.
Figure 9:
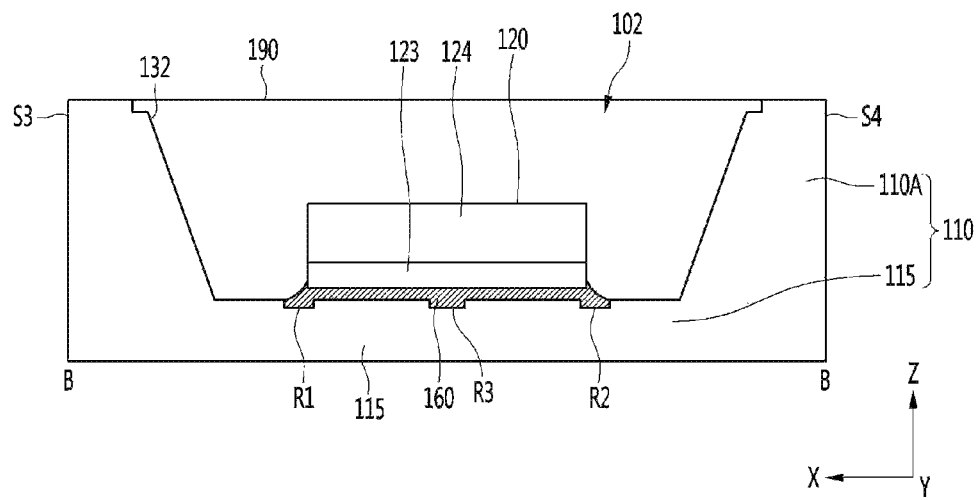
FIG. 9 is a cross-sectional view taken along a line C-C of the light emitting device package of FIG. 7.

As shown in FIGS. 7 to 9, a concave upper recess may be disposed on the upper portion of the package body 110 of the light emitting device package 100. The upper recesses may be arranged in one or a plurality of the recesses, and each of the upper recesses may overlap at least part or all of the upper surface of the package body 110 in the vertical direction with the light emitting device 120. When the upper recess has a plurality of recesses, at least one upper recess may overlap at least part or all of the light emitting device 120. The plurality of upper recesses may be arranged in a second direction under a region of the light emitting device 120.

The upper recess may include first and second upper recesses R1 and R2 spaced from each other. The first upper recess R1 is arranged in a direction of the third side surface S3 in a region between the first and second through holes TH1 and TH2 and the second upper recess R2 is arranged in a direction of the forth side surface S4 in the region between the first and second through holes TH1 and TH2. The first and second upper recesses R1 and R2 may be disposed concavely in a downward direction at an upper portion of the body 115.

The package body 110 may include a concave third upper recess R3 in a region between the first and second through holes TH1 and TH2. The third upper recess R3 may be recessed from the upper surface of the body 115 in a downward direction. The third upper recess R3 may be disposed between the first and second through holes TH1 and TH2. Each of the upper recesses R1, R2 and R3 may be concavely recessed from the bottom surface of the cavity or the upper surface of the body 115 in a downward direction.

The number of the upper recesses R1, R2 and R3 may be one or a plurality of, but three will be described for convenience of explanation.

A portion of the first resin 160 may be disposed on the upper recesses R1, R2 and R3. The first resin 160 disposed on the upper recesses R1, R2 and R3 is bonded to the lower surface of the light emitting device 120 to prevent the light emitting device 120 from tilting or flowing. The upper recesses R1, R2 and R3 may enhance the supporting force of the first resin 160. The upper recesses R1, R2 and R3 may be disposed on the body 115 or may be combined with a portion of the first resin 160. The first and second upper recesses R1 and R2 include an inner portion at least a portion of which overlaps with the light emitting device 120 in the vertical direction and an outer portion at least a portion of which protrudes outward from the side surface of the light emitting device 120. Since the first and second upper recesses R1 and R2 partially protrude outward from the inside of the light emitting device 120, the first resin 160 diffused according to the pressing of the light emitting device 120 may be filled to the first and second upper recesses R1 and R2. The first resin 160 may be bonded between the body 115 and the light emitting device 120. The first resin 160 may be in contact with the side surfaces of the first and second bonding portions 121 and 122. The first resin 160 may be in contact with the first and second bonding portions 121 and 122 and may be contacted with an outer surface of the conductive portion 171 and 173 disposed in the through holes TH1 and TH2 through the first and second through holes TH1 and TH2. The third recess R3 overlaps with the light emitting device 120 in the vertical direction and may be disposed under the region between the first and second bonding portions 121 and 122. The third recess R3 may support the first resin 160. The first and second recesses R1 and R2 may be connected to the second resin 162 disposed around the lower portion of the light emitting device 120 or may support the second resin 162.

The depth of the upper recesses R1, R2 and R3 may be a predetermined depth from the upper surface of the package body 110, and may be, for example, 20 μm or more or in a range of 20 to 60 μm. If the depth of the upper recesses R1, R2 and R3 is larger than the above range, a rigidity of the body 115 may be deteriorated. If the depth is smaller than the above range, a bearing force may be insignificant. The depth of the upper recesses R1, R2 and R3 may be smaller than the thickness of the body 115 or the side height of the body 115. The third upper recess R3 may have the same shape or different shape as the first and second upper recesses R1 and R2. The third upper recess R3 may be disposed between the first and second upper recesses R1 and R2. The first resin may be disposed on the first to third upper recesses R1, R2 and R3 and adhered to the lower surface of the light emitting device 120.

As another example of the invention, one or more additional recesses may be disposed along a lower periphery of the light emitting device 120, such that any one of the first and second resin 160 and 162.

The second resin 162 may include a reflective resin material. The second resin 162 may be disposed along the lower periphery of the light emitting device 120. The second resin 162 may adhere the light emitting device 120 to the body 115. The second resin 162 may include a resin material such as silicone or epoxy. The second resin 162 may include a metal oxide or a filler therein. For example, the second resin 162 may be composed of a material containing a metal oxide or an impurity such as $TiO_2$, $SiO_2$, $Al_2O_3$, or the like. The second resin 162 may be the same material as the first resin 160 or may be a different material. The second resin 162 may have a higher impurity content than the impurity content added to the first resin 160. The second resin 162 may contact or be spaced from the side 132 of the cavity 102.

Figure 10:
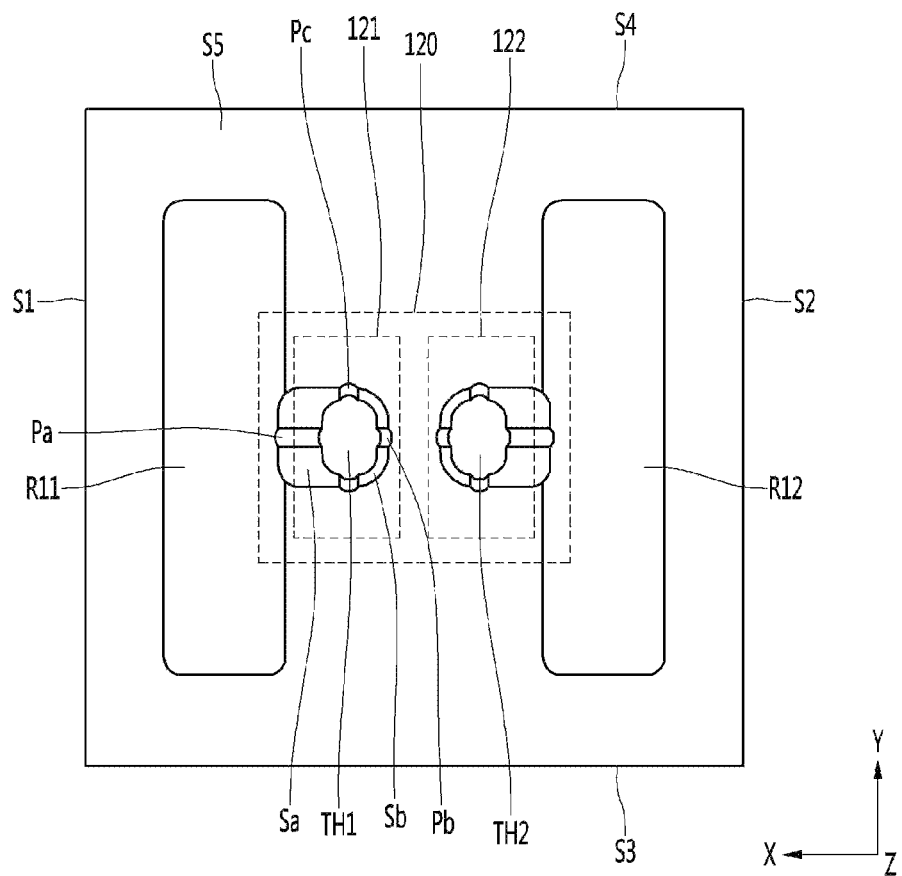
FIG. 10 is another example of the through hole and the recess of the light emitting device package of FIG. 2.

As shown in FIG. 10, at least one or both of the first and second through holes TH1 and TH2 may include protruding portions Pa, Pb and Pc having a groove or trench structure on surfaces thereof. The protruding portions Pa, Pb and Pc may roughly provide the surfaces of the through holes TH1 and TH2. The protruding portions Pa, Pb and Pc may protrude outward from the center of the through holes TH1 and TH2. The protruding portions Pa, Pb and Pc may be disposed in one or more of the through holes TH1 and TH2. The plurality of protruding portions Pa, Pb and Pc may protrude in at least two directions from the center of the through holes TH1 and TH2. The protruding portions Pa, Pb and Pc may extend from an upper edge to a lower edge of the through holes TH1 and TH2. The protruding portions Pa, Pb and Pc may have a groove shape or a protrusion shape extending from the upper edge to the lower edge of the through holes TH1 and TH2. The groove or protrusion shape may be a structure that is further away from a center than the surfaces of adjacent through holes, or may be a structure protruding toward the center of the hole. The protruding portions Pa, Pb and Pc may be arranged along the second inner side Sb and/or the first inner side Sa of the through holes TH1 and TH2. The protruding portions Pa, Pb and Pc may be increased in adhesion area with the conductive portions 171 and 173 filled in the through holes TH1 and TH2, as shown in FIGS. 10 and 4. The protruding portions Pa, Pb and Pc may increase the adhesion area of the through holes TH1 and TH2 to metal portions M1 and M2, as shown in FIGS. 10 and 12 to 14. As another example, the concavo-convex structure may be disposed on the surface of the through holes TH1 and TH2, or may be arranged in the horizontal direction or the vertical direction.

Second Embodiment

FIG. 11 is a light emitting device package according to a second embodiment, and a description of the same parts as those of the first embodiment is omitted, and the configuration of the first embodiment may be selectively applied.

FIG. 11, the light emitting device package includes the first and second through holes TH1 and TH2 of the body 115 and the conductive portions 171 and 173 described above in the first and second through holes TH1 and TH2, and lower metal portions 181 and 183 under the conductive portions 171 and 173.

A center of the upper surfaces and a center of the lower surfaces of the first and second through holes TH1 and TH2 may be disposed at different positions from each other. A distance between the center of the lower surface of the first through hole TH1 and the center of the lower surface of the second through hole TH2 in the first direction may be different from the distance between the centers of the upper surfaces of the first and second through holes TH1 and TH2. The distance between the center of the lower surface of the first through hole TH1 and the center of the lower surface of the second through hole TH2 in the first direction may be greater than the distance between the centers of the upper surfaces of the first and second through holes TH1 and TH2. The center of the lower surface of the first through hole TH1 is moved in the direction of the first side surface S1 with respect to the center of the upper surface and the center of the lower surface of the second through hole TH2 may be moved in the direction of the second side surface S2 with respect to the center of the upper surface. The Inclination angles of the two inner side surfaces Sa and Sb facing each other in the first and second through holes TH1 and TH2 may be differently provided. For example, the inclination angle of the first inner side surface Sa may be greater than the inclination angle of the second inner side surface Sb with respect to the lower surface of the first through hole TH1 in the first through hole TH1. For example, the inclination angle of the first inner side surface Sa may be greater than the inclination angle of the second inner side surface Sb with respect to the horizontal lower surface of the second through hole TH2 in the first through hole TH2. The inclination angle of the first and second inner side surfaces Sa and Sb may be an imaginary straight line extending from the upper end of each through hole to the lower end. In the first and second through holes TH1 and TH2, the first inner side surface Sa may be a sloped surface, or a surface to which a vertical surface and an inclined surface are connected, or a concave surface. In the first and second through holes TH1 and TH2, the second inner side surface Sb may be a sloped surface, or a surface to which a vertical surface and an inclined surface are connected, or a concave surface. As another example, in the second inner side surface Sb of the first and second through holes TH1 and TH2, when the upper portion is a vertical surface and the lower portion is a sloped surface, a height of the lower portion having the sloped surface in the through holes TH1 and TH2 may be greater than a height of the upper portion having the vertical surface. An upper end of the first inner side surface Sa and an upper end of the second inner side surface Sb in the first and second through holes TH1 and TH2 may be curved or angled. Since the first inner side surface Sa of the first and second through holes TH1 and TH2 has an area larger than that of the second inner side surface Sb and is provided as an inclined surface, the first inner side surface Sa may increase the adhesive force with the resin material included in the conductive portions 171 and 173. The conductive portions 171 and 173 may be easily injected through the lower portions of the first and second through holes TH1 and TH2 and the contact area with the conductive portions 171 and 173 may be increased. Further, since the injection efficiency is increased, generation of voids in the region between the conductive portions 171 and 173 and the bonding portions 121 and 122 may be suppressed. The conductive portions 171 and 173 may be disposed in the through holes TH1 and TH2.

The first and second through holes TH1 and TH2 may be disposed in a region overlapping the region of the light emitting device 120 in the vertical direction. A top view shape of the first and second through holes TH1 and TH2 may include at least one of an ellipse, a polygonal shape, or an irregular shape having a straight line and a curved line. A length of the upper portion of the first and second through holes TH1 and TH2 may be provided with the same length in the first direction and the second direction or may be provided with a longer length in either one direction. A length of the lower portion of the first and second through holes TH1 and TH2 may have the same length in the first direction and the second direction, or may have a longer length in either direction.

The first through hole TH1 may be disposed at one or a plurality of locations under the first bonding portion 121 of the light emitting device 120. The second through holes TH2 may be disposed at one or a plurality of locations under the second bonding portion 122 of the light emitting device 120. The first through holes TH1 face the first bonding portions 121 of the light emitting device 120 and may be arranged in the same number as the first bonding portions 121. The second through holes TH2 may face the second bonding portions 122 of the light emitting device 120 and may be arranged in the same number as the second bonding portions 122. The first and second through holes TH1 and TH2 may be the same or different from each other in the upper shape and the lower shape. The first and second through holes TH1 and TH2 may be symmetrical with respect to the upper shape and the lower shape. The first and second through holes TH1 and TH2 may be asymmetrical in the upper shape and the lower shape. The first and second through holes TH1 and TH2 may be disposed on the vertical line where the center of the upper shape and the center of the lower shape are the same in at least one of the first direction and the second direction. For example, the upper shape and the lower shape of the first and second through holes TH1 and TH2 may be different from each other, or the centers of the upper and lower portions in the upper and lower shapes may be disposed at different positions with respect to the first direction. The upper and lower shapes of the first and second through holes TH1 and TH2 may be different from each other or the centers of the upper and lower portions in the upper and lower shapes may be different from each other with respect to the second direction. The first and second conductive portions 171 and 173 may be disposed in the first and second through holes TH1 and TH2. The first and second conductive portions 171 and 173 will be described with reference to the first embodiment.

Lower metal portions 181 and 183 may be disposed under the first and second conductive portions 171 and 173 and may be formed of a different metal from the first and second conductive portions 171 and 173. The lower metal portions 181 and 183 may be formed of metal, and may be a single layer or a multi-layer structure. The lower metal portions 181 and 183 may be formed of at least one material or alloy selected from the group consisting of Ti, Cu, Ni, Au, Cr, Ta, Pt, Sn, Ag, P, Fe, Sn, Zn, or Al.

The lower metal portions 181 and 183 may be in contact with the lower surface of the body 115. The lower metal portions 181 and 183 may include a first lower metal portion 181 under the first conductive portion 171 and a second lower metal portion 183 under the second conductive portion 173. The first lower metal portion 181 may be disposed on the lower surface of the body 115 and on the lower surface of the first conductive portion 171 and may be spaced apart from the second lower metal portion 183. The second lower metal portion 183 may be disposed on the lower surface of the body 115 and on the lower surface of the second conductive portion 173 and may be spaced apart from the first lower metal portion 181.

The lower surface area of the first and second lower metal portions 181 and 183 may be 30% or 50% of the lower surface area of the body 115. The first and second lower metal portions 181 and 183 may perform electrical bonding between the pads of the circuit board and the first and second conductive portions. Since the first and second lower metal portions 181 and 183 are provided in the above areas, the electrical path and the heat radiation area may be increased.

Figure 12:
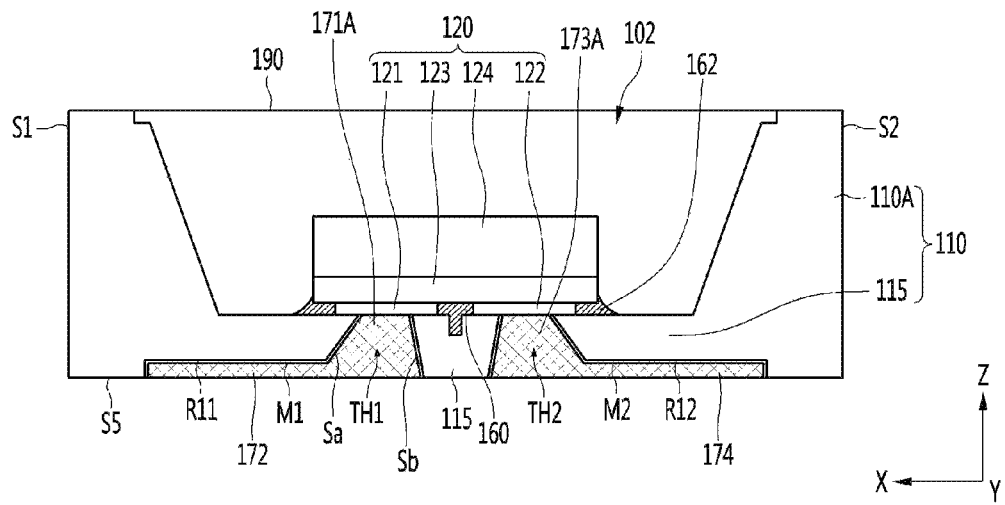
FIG. 12 is a side sectional view of a light emitting device package according to the third embodiment.

FIG. 12 is an example of a side sectional view of a light emitting device package according to the third embodiment. In describing the third embodiment, the description of the same parts as those of the first embodiment is omitted, and the configuration of the first embodiment may be selectively applied.

As shown in FIG. 12, the light emitting device package includes through holes TH1 and TH2 of the body 115, metal portions M1 and M2 on the surfaces of the through holes TH1 and TH2, and conductive portions 171A and 173A on the surface of the metal portions M1 and M2.

Figure 14:
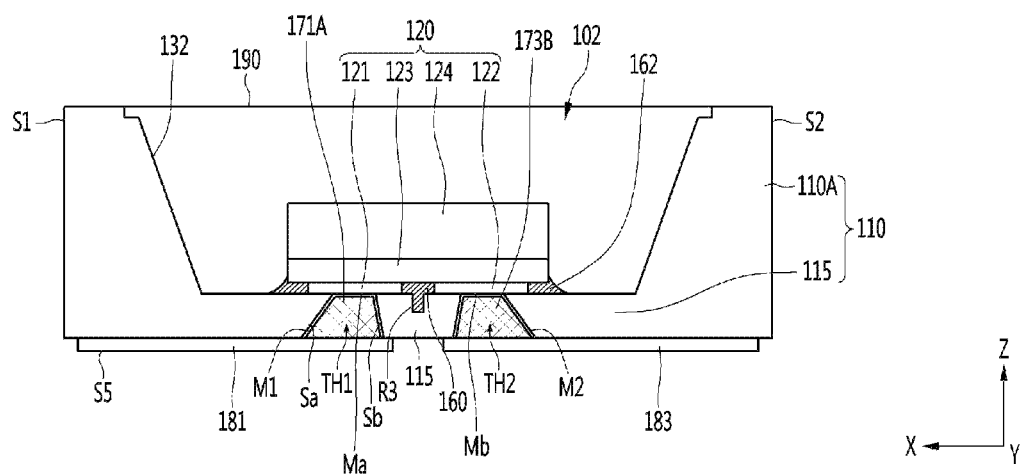
FIG. 14 is a side cross-sectional view of a light emitting device package according to the fourth embodiment.

The metal portions M1 and M2 may include first and second metal portions M1 and M2 spaced from each other. The first metal portion M1 and the second metal portion M2 may be physically separated. The first metal portion M1 and the second metal portion M2 may be arranged so as not to overlap each other in the vertical direction or the Z direction. The first metal portion M1 may be disposed on at least one of the surface of the first through hole TH1 and the surface of the first recess R11. The second metal portion M2 may be disposed on at least one or both of the surface of the second through hole TH2 and the surface of the second recess R12. The first metal portion M1 may be disposed on the entire surface of the first through hole TH1 and may extend to the upper surface of the first recess R11. The second metal portion M2 may be disposed on the entire surface of the second through hole TH2 and may extend to the upper surface of the second recess R12. Here, the first and second through holes TH1 and TH2 may be provided in the package as shown in FIG. 14 without a recess.

The first metal portion M1 may be partially exposed on the upper surface of the first through hole TH1. The second metal portion M2 may be partially exposed on the upper surface of the second through hole TH2. The upper surface of the first metal portion M1 may be disposed on the same plane as the upper surface of the package body 110 disposed on the lower portion of the light emitting device 120, on the upper surface of the first through hole TH1. The upper surface of the second metal portion M2 may be disposed on the same plane as the upper surface of the package body 110 disposed on the lower portion of the light emitting device 120, on the upper surface of the second through hole TH2. The first and second metal portions M1 and M2 may be disposed around the first and second through holes TH1 and TH2. The inner holes of the first and second metal portions M1 and M2 may be center holes or inner holes of the first and second through holes TH1 and TH2 vertically penetrating. A thickness of the first and second metal portions M1 and M2 may be smaller than the depth of the recesses R11 and R12. The lower surface of the first and second metal portions M1 and M2 may be disposed above the lower surface of the body 115.

The thickness of the first metal portion M1 may be less than ⅓ of a width of the upper portion of the first through hole TH1 or a narrower width of widths of the first and second directions, and a hole may be provided in the center of the first through hole TH1 in the inner portion M1. The thickness of the second metal portion M2 may be less than ⅓ of the width of the upper portion of the second through hole TH2 or a narrower width of widths of the first and second directions, and a hole may be provided in the center of the second through hole TH2 in the inside of the portion M2. The total thickness of the first metal portion M1 and the second metal portion M2 may be smaller than the width of the upper portion of the first through hole TH1 or the second through hole TH2 in the first and second directions. Here, the thicknesses of the first and second metal portions M1 and M2 may be the same.

The first metal portion M1 and the second metal portion M2 may be provided as a metal. The first and second metal portions M1 and M2 may be formed of at least one selected from the group consisting of copper (Cu), titanium (Ti), nickel (Ni), gold (Au), chromium (Cr), tantalum (Ta), tin (Sn), and silver (Ag), and may be formed as a single layer or a multilayer. The first metal portion M1 and the second metal portion M2 may be multilayers and may include a first layer contacting the package body 110 and a second layer under the first layer, The first layer includes at least one of Ti, Cr, Ta, and Pt, and the second layer may include at least one of Au, Ag, and Cu. The first and second metal portions M1 and M2 may have a thickness of 1 μm or less. The first and second metal portions M1 and M2 may function as a seed layer to which the conductive portions 321 and 323 are bonded. The first and second metal portions M1 and M2 may be formed on the surface of the package body 110 through a deposition process or a plating process.

The first and second metal portions M1 and M2 may be separated from the lower surface S5 of the body 115 or may not be formed on the lower surface S5. The first and second metal portions M1 and M2 disposed in the recesses R11 and R12 are disposed between the upper surfaces of the recesses R11 and R12 and the conductive portions 171A and 173A. The first and second metal portions M1 and M2 disposed in the through holes TH1 and TH2 may be disposed between the surfaces of the through holes TH1 and TH2 and the conductive portions 171A and 173A. The first and second metal portions M1 and M2 may reduce or prevent an area in which the conductive portions 171A and 173A are directly in contact with the body 115 of the resin material so that the conductive portions 171A and 173A may be suppressed and may be supported with a uniform distribution thickness.

Here, the first conductive portion 171A may be disposed in the first through hole TH1, and the second conductive portion 173A may be disposed in the second through hole TH2. The first and second metal portions M1 and M2 may be disposed between the first and second conductive portions 171A and 173A and the body 115. This is because the first and second conductive portions 171A and 173A may not directly contact the body 115 of the resin material. Accordingly, the first and second conductive portions 171A and 173A may be made of various materials.

The first and second conductive portions 171A and 173A may be used of the epoxy-based adhesive and metal disclosed in the first embodiment. The material of the first and second conductive portions 171A and 173 may include an amine-based resin adhesive or an epoxy-based resin adhesive and a metal. The adjacent metals in the first and second conductive portions 171A and 173A may be connected to each other through a migration process. The adjacent metals in the first and second conductive portions 171A and 173A are connected to each other and may be mixed with an adhesive. The material of the first and second conductive portions 171A and 173A may include a sinter paste. Since the materials of the first and second conductive portions 171A and 173A are not bonded to silicon, they are bonded to the metal using an amine-based resin adhesive and may be selectively bonded to the resin. These conductive portions 171A and 173A may be filled with an amine-based resin adhesive in the space between the metal links.

A weight % of the metal may be higher than a weight % of the resin based on the weight of the first and second conductive portions 171A and 173A. The conductive portions 171A and 173A may have a weight % of metal greater than a weight % of the resin, and may be, for example, at least 1 time or at least 2 times. The weight % of the conductive portions 171A and 173A may be 50 wt % or more based on a total weight. The conductive portions 171A and 173A may have the weight % of the metal ranging from 50 wt % to 75 wt % based on the total weight. If the weight % of the metal in the conductive portions 171A and 173A is less than the above range, the curing rate may be lowered. If the weight % is larger than the above range, the adhesion strength with the metal portions M1 and M2 may be deteriorated. These conductive portions 171A and 173A may be provided as a metal paste having a weight % of the metal.

The weight % of the resin of the conductive portions 171A and 173A may be less than the weight % of the metal, for example, 0.5 times or less or 0.4 times or less. According to an embodiment of the present invention, the conductive portions 171A and 173A may include 25 wt % or more of resin based on the total weight. For example, the amine-based resin adhesive may be in the range of 20 wt % to 50 wt % based on the total weight % of the conductive portions 171A and 173A. That is, when the body 115 is made of a resin material, the amine-based resin adhesive has a problem that the adhesive force with the body 115 is low. For this purpose, metal portions M1 and M2 may be formed between the conductive portions 171A and 173A and the body 115 to have a small thickness.

The resin of the conductive portions 171A and 173A may be in contact with the metal portions M1 and M2 without contact with the body 115. If the weight % of the resin in the conductive portions 171A and 173A is smaller than the above range, the contact area with the metal portions M1 and M2 may be reduced, and the conductive portion may be caused to flow or be separated. If the weight % of the resin in the conductive portions 171A and 173A is larger than the above range, the weight % of the metal may increase, and the electrical characteristics and heat radiation characteristics may be deteriorated. The resin in the conductive portions 171A and 173A may support metal particles or metal links by squeezing or shrinking after printing a metal paste and then performing thermal curing. At this time, the metal particles and the metal link are connected to each other and may be exposed to the outer surface. At this time, the metal particle or the metal link may be filled with the resin in an area or outside between metal particles or metal links connected to each other. The metal may include at least one of gold (Au), silver (Ag), and copper (Cu). The metal may be provided as a single or double structure of gold (Au), silver (Ag), or copper (Cu). In the case of the double structure, the first metal may be a structure of a second metal surrounding the first metal. The first and second metals may be any one of gold (Au), silver (Ag), and copper (Cu), and may include different metals. The first metal/second metal may include at least one of, for example, a structure of Ag/Cu, a structure of Cu/Ag, a structure of Au/Cu, and a structure of Cu/Au. Since the second metal is provided in a form to surround the first metal, it may be an anti-oxidation metal.

Figure 13:
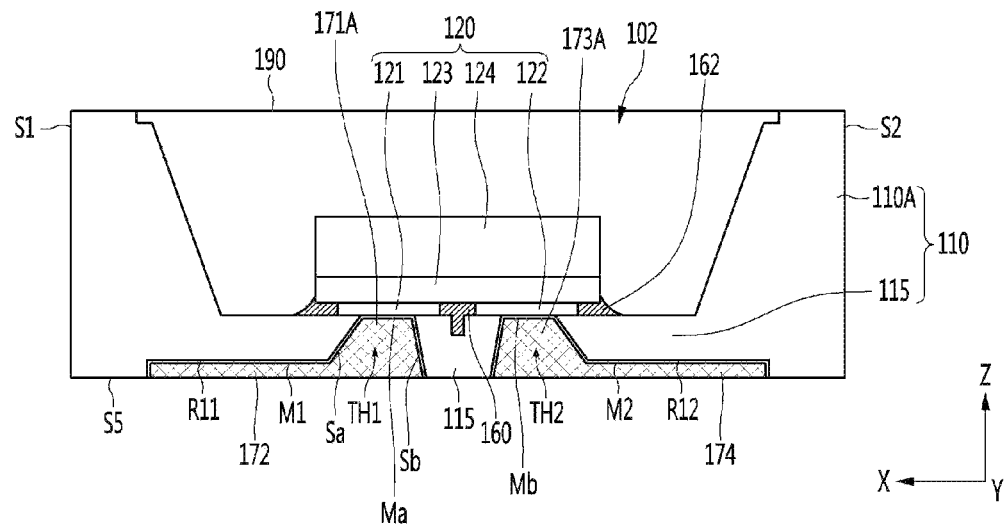
FIG. 13 is another example of the light emitting device package of FIG. 12.

In the FIGS. 12 to 14, a package structure is a structure in which a metal portion is formed on the surfaces of the through holes TH1 and TH2 of the body 115, and the conductive portions 171A and 173A are not in contact with the surface of the body 115. In this structure, the material of the conductive portions 171A and 173A may include a paste material having good adhesion to the metal portions M1 and M2. For example, the conductive portions 171 and 173 may have a metal content of 50 wt % or more, or in a range of 50 wt % to 75 wt % based on the total weight. If the weight % of the metal in the conductive portions 171A and 173A is less than the above range, the curing may be lowered. If the weight % is larger than the above range, the adhesion strength with the metal portions M1 and M2 may be reduced. The weight % of the resin in the conductive portions 171A and 173A may be smaller than the weight percent of the metal, and may be 1 times or less, for example, 0.5 times or less. The conductive portions 171A and 173A may include at least 25 wt % of resin based on the total weight of the conductive portions 171A and 173A. For example, the amine-based resin may be in a range 25 wt % to 50 wt % based the total weight of the conductive portions 171A and 173A. Such the metal and resin may improve the adhesion with the metal portions M1 and M2. A material of the conductive portions 171A and 173A may be not used of tin (Sn), or flux and the like and may provide a metal plate in which a resin-based adhesive and a metal are mixed. The resin adhesive may be used to support or fix the metal in the through holes TH1 and TH2. In the conductive portions 171A and 173A, the resin adhesive may be epoxy-based, or a thermosetting or photo-curing resin material.

As shown in FIG. 12, the conductive portions 171A and 173A may be disposed under the metal portions M1 and M2 disposed in the recesses R11 and R12. The metal portions M1 and M2 may surround the conductive portions 171A and 173A in the through holes TH1 and TH2 and the recesses R11 and R12. The lower ends of the metal portions M1 and M2 may be exposed to the lower surface of the body. The upper ends of the metal portions M1 and M2 may be disposed around the through holes TH1 and TH2 and may be spaced from the center of the upper surfaces of the through holes TH1 and TH2.

As shown in FIG. 13, the metal portions M1 and M2 may extend to the upper surfaces of the through holes TH1 and TH2. The metal portions M1 and M2 may cover the upper surfaces of the through holes TH1 and TH2 and may be in contact with and connected to the first and second bonding portions 121 and 122. That is, the first metal portion M1 includes a first metal extension part Ma, and the first metal extension part Ma is disposed on an upper surface of the first through hole TH1 facing the first bonding portion 121. The first metal extension part Ma may be disposed between the first conductive portion 171A and the first bonding portion 121.

The second metal portion M2 includes a second metal extension part Mb and the second metal extension part Mb may be disposed an upper surface of the second through hole TH2 facing the second bonding portion 122. The second metal extension part Mb may be disposed between the second conductive portion 173A and the second bonding portion 122. The first and second metal portions M1 and M2 are bonded to the first and second bonding portions 121 and 122 and may be bonded to the metal of the first and second conductive portions 171A and 173A.

FIG. 14 is another example of FIG. 13, which is a light emitting device package according to the fourth embodiment. In describing the fourth embodiment, description of the same parts as those of the first to third embodiments is omitted, and the configuration of the above-described embodiment may be selectively applied.

As shown in FIG. 14, the light emitting device package includes through holes TH1 and TH2 of the body 115, metal portions M1 and M2 on a surface of the through holes TH1 and TH2, and conductive portions 171A and 173A on the surface of the metal portions M1 and M2.

The body 115 is provided with through holes TH1 and TH2 without a recess and first and second bottom metal portions 181 and 183 may be disposed under the body 115. The configuration of the lower metal portions 181 and 183 may be dedicated to the description of FIG. 11.

The first bonding portion 121 and the second bonding portion 122 of the light emitting device 120 are provided with driving power through the first and second metal portions M1 and M2 and the conductive portions 171A and 173A. The melting points of the conductive portions 171A and 173A may be selected to have a higher value than the melting points of the other bonding materials.

The light emitting device package disclosed in the embodiments of the present invention may be provided and mounted on a submount or a circuit board or the like. However, since a conventional light emitting device package is mounted on a submount, a circuit board or the like, a high temperature process such as a reflow process may be applied. At this time, in the reflow process, a re-melting phenomenon occurs in the bonding region between the conductive portion and the light emitting device provided in the light emitting device package, so that the stability of electrical connection and physical connection may be weakened. Therefore, the light emitting device package according to the embodiment does not cause a re-melting phenomenon even when it is bonded to a circuit board or a main substrate through a reflow process, so that electrical connection and physical bonding force are not deteriorated. Further, in the process of manufacturing the light emitting device package, the package body does not need to be exposed to a high temperature. Therefore, it is possible to prevent the package body from being exposed to a high temperature to be damaged or discolored. Accordingly, the selection range for the material constituting the package body may be widened. According to the embodiment, the package body 110 may be provided using not only expensive materials such as ceramics but also relatively low-cost resin materials. For example, the package body 110 may include at least one material selected from a group containing a PPA (Polyphthalamide) resin, PCT (PolyCyclohexylenedimethylene Terephthalate) resin, EMC (Epoxy Molding Compound) resin, or SMC (Silicone Molding Compound) resin.

Referring to FIG. 15, a light emitting device package may include a package body 110 having a plurality of cavities 102 and 102A. The light emitting devices 120 and 120A disposed in the respective cavities 102 and 102A may be connected to each other in series or in parallel. The through holes TH1 and TH2 may be disposed under the light emitting devices 120 and 120A. This structure may be applied to the first to fourth embodiments. The body 115 includes a plurality of recesses R11, R12 and R13 on the lower surface thereof. The first recess R11 is formed on the first bonding portion 121 of the first light emitting device 120, and the second recess R12 is disposed in the periphery of the second through hole TH2 facing the second bonding portion 122 of the second light emitting device 120A. The third recess R13 may be disposed between the first and second recesses R11 and R12 and may connect a second through hole TH2 disposed in the first cavity 102 and a first through hole TH1 disposed in the second cavity 102A to each other. The third recess R13 may be disposed under an intermediate body 113 disposed between the first and second cavities 102 and 102A.

Each of the recesses R11, R12, and R13 may be provided with the metal portions M1, M2, and M3 described above. The third metal portion M3 of the metal portions M1, M2 and M3 may dispose to a surface of the third recess R12, a surface of the second through hole TH2 arranged in the first cavity 102, and a surface of the first through hole TH1 disposed in the second cavity 102 102A. Through such a structure, a plurality of light emitting devices may be arranged in different cavities, and may be connected to each other through a conductive portions filled in the through hole at the bottom of each cavity.

The conductive portions 171A, 173A, 175, and 176 may be disposed on the metal portion M1, M2, and M3 disposed in the recess R11, R12, and R13 and the through hole TH1 and TH2. Here, the package of the first and second embodiments may be provided without the metal portion.

FIG. 16 is an example of a light source device having a light emitting device package according to an embodiment of the present invention As shown in FIG. 16, the conductive portions 171 and 173 may be disposed in the first and second through holes TH1 and TH2 and the first and second recesses R11 and R12 of the light emitting device package 101. A first conductive portion 171 is disposed in the first through hole TH1 and the first recess R11 and a second conductive portion 173 is disposed in the second through hole TH2 and the second recess R12. The first conductive portion 171 may connect the first bonding portion 121 of the light emitting device 120 and the first pad 211 of the circuit board 201. The second conductive portion 173 may connect the second bonding portion 122 of the light emitting device 120 and the second pad 213 of the circuit board 201.

The first conductive portion 171 may be in contact with the surface of the first recess portion R11 and the surface of the first through hole TH1. The second conductive portion 173 may be in contact with the surface of the second recess R12 and the surface of the second through hole TH2.

The first conductive portion 171 may overlap the first bonding portion 121 of the light emitting device 120 in the vertical direction. The second conductive portion 173 may overlap the second bonding portion 122 of the light emitting device 120 in the vertical direction. Accordingly, the electrical and thermal paths of the first and second conductive portions 171 and 173 may be minimized.

The circuit board 201 may be a printed circuit board (PCB). The circuit board 201 may include at least one of a resin-based PCB, a metal core PCB (MCPCB), a flexible PCB (FPCB), and a rigid PCB. In the circuit board 201, an insulating layer or a protective layer is disposed on a base layer made of resin or metal, and the pads 211 and 213 exposed from the insulating layer or the protective layer are disposed. The pads 211 and 213 may electrically connect one or a plurality of light emitting device packages. The insulating layer or the protective layer may be a solder resist material or a resin material.

Each of the pads 211 and 213 of the circuit board 201 is made of, for example, at least one selected from the group consisting of Ti, Cu, Ni, Au, Cr, Ta, Pt, Sn, Ag, P, Fe, Sn, or an alloy thereof.

Here, in the bonding process of the conductive portions 171A and 173A, the first and second conductive portions 171A and 173A are provided and cured by a screen printing method to a liquid material, since to proceed the reflow process. At this time, the light emitting device package is placed on the first and second pads 211 and 213 of the circuit board 201 and then bonded on the circuit board 201. At this time, the first conductive portion 171A disposed on the first pad 211 is injected into the first bonding portion 121 and the first pad 211 through the first through hole TH1, and the second conductive portion 173A disposed on the pad 213 may be connected to the second pad 213 in addition to the second bonding portion 122. At this time, since the resin-based adhesive of the metal paste supports the metals of the conductive portions 171A and 173A, it is possible to prevent the first and second conductive portions 171A and 173A from being spread or diffused. The body 115 disposed between the first and second conductive portions 171A and 173A may prevent the liquid metal paste from diffusing and the electric power between the first and second conductive portions 171A and 173A Interference may be prevented.

In the embodiments, The first and second recesses R11 and R12 guide the flow or diffusion of the conductive portions 171A and 173A and the lower surface of the body may be provided as hooks or grooves so that the conductive portions 171A and 173A may be improved the bonding. Since the conductive portions 171A and 173A are provided by the printing method, it is possible to prevent a problem of electrical open due to uneven distribution of the conductive portions 171A and 173A and a problem of deterioration of heat transfer efficiency. Since the resin is exposed on a part of the surface of each of the through holes TH1 and TH2 and the metal portions M1 and M2 are disposed on the other surfaces of the through holes TH1 and TH2 in the through holes TH1 and TH2 in which the conductive portions 171A and 173A are disposed, it is possible to suppress formation of voids or to reduce the amount of voids. The light emitting device package described above may be disposed on the circuit board 201 in one or more. The light emitting device package may be electrically connected to the light emitting device 120 through the conductive portions 171A and 173A disposed on the pads 211 and 213 of the circuit board 201.

The effect according to the embodiment of the invention is as follows. It is possible to improve the electrical connection with the bonding portion by providing the through hole of the body facing the bonding portions of the semiconductor device or the light emitting device. The conductive portion may be provided in the through hole of the body to improve the electrical connection with the bonding portion. The electrical reliability of the package may be improved by providing a conductive portion of a paste material having metal and resin in the through hole of the body. The electrical connection of the package may be improved by providing a conductive portion having a metal content of 50 wt % or more and a resin content of 10 wt % or more in the through hole of the body. The conductive portion is filled in the recess disposed in a periphery of the through hole of the body, so that the crack of the conductive portion may be suppressed or prevented. A metal portion is disposed on the through hole and the recess of the body and the conductive portion is disposed on the metal portion to improve the electrical reliability of the conductive portion connected through the through hole. The conductive portion and the bonding portion of the light emitting device are connected to each other through the through hole of the body to improve the adhesive force and the electrical conductivity of the bonding portion of the flip chip. The first resin may be disposed between the lower portion of the device and the body to improve the adhesive force and the supporting force of the device. It is possible to dispose the recess on the upper part of the body and dispose the first resin on the lower part of the device to improve the adhesive force and the supporting force of the device.

According to embodiments of the present invention, light extraction efficiency, electrical characteristics and reliability may be improved, process efficiency may be improved, a new package structure may be provided, manufacturing cost may be reduced, and manufacturing yield may be improved. In addition, it is possible to prevent the re-melting phenomenon from occurring in the bonding region of the semiconductor device package in the process of re-bonding the semiconductor device package to the substrate. Accordingly, the reliability of the semiconductor device package or the light emitting device package and the light source device having the same may be improved.

Figure 17:
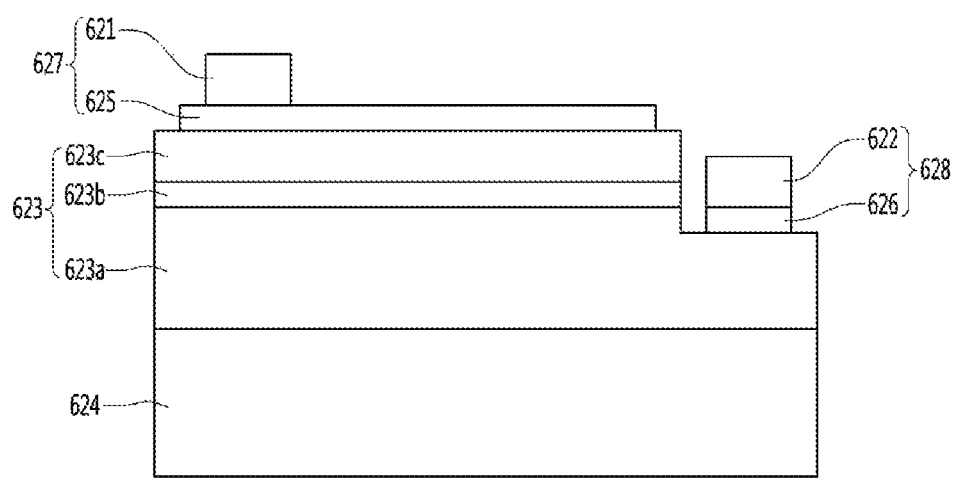
FIG. 17 is an example of a light emitting device of a light emitting device package according to an embodiment of the present invention.

FIG. 17 is a cross-sectional view illustrating an example of a light emitting device applied to a light emitting device package according to an embodiment of the present invention. Referring to FIG. 17, the light emitting device conceptually shows only a relative arrangement of the first electrode 627 and the second electrode 628. The first electrode 627 may include a first bonding portion 621 and a first branched electrode 625. The second electrode 628 may include a second bonding portion 622 and a second branched electrode 626. The light emitting device may include a light emitting structure 623 disposed on the substrate 624. The substrate 624 may be selected from the group consisting of a sapphire substrate ($Al_2O_3$), SiC, GaAs, GaN, ZnO, Si, GaP, InP and Ge. For example, the substrate 624 may be provided as a patterned sapphire substrate (PSS) having a concavo-convex pattern formed on its upper surface.

The light emitting structure 623 may include a first conductivity type semiconductor layer 623a, an active layer 623b, and a second conductivity type semiconductor layer 623c. The active layer 623b may be disposed between the first conductivity type semiconductor layer 623a and the second conductivity type semiconductor layer 623c. For example, the active layer 623b may be disposed on the first conductivity type semiconductor layer 623a, and the second conductivity type semiconductor layer 623c may be disposed on the active layer 623b.

The first conductivity type semiconductor layer 623a may be provided as an n-type semiconductor layer, and the second conductivity type semiconductor layer 623c may be provided as a p-type semiconductor layer. According to another embodiment, the first conductivity type semiconductor layer 623a may be provided as a p-type semiconductor layer, and the second conductivity type semiconductor layer 623c may be provided as an n-type semiconductor layer.

The light emitting device may include a first electrode 627 and a second electrode 628. The first electrode 627 may include a first bonding portion 621 and a first branched electrode 625. The first electrode 627 may be electrically connected to the second conductivity type semiconductor layer 623c. The first branched electrode 625 may be branched from the first bonding portion 621. The first branched electrode 625 may include a plurality of branched electrodes branched from the first bonding portion 621. The second electrode 628 may include the second bonding portion 622 and the second branched electrode 626. The second electrode 628 may be electrically connected to the first conductivity type semiconductor layer 623a. The second branch electrode 626 may be branched from the second bonding portion 622. The second branched electrode 626 may include a plurality of branched electrodes branched from the second bonding portion 622.

The first branched electrode 625 and the second branched electrode 626 may be arranged to be shifted from each other in a finger shape. The power supplied through the first bonding portion 621 and the second bonding portion 622 by the first branched electrode 625 and the second branched electrode 626 is supplied by spreading to the entirety of the light emitting structure 623.

The first electrode 627 and the second electrode 628 may have a single-layer structure or a multi-layer structure. For example, the first electrode 627 and the second electrode 628 may be ohmic electrodes. For example, the first electrode 627 and the second electrode 628 may be formed of at least one selected from the group consisting of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au or Hf or an alloy of two or more of them.

The light emitting structure 623 may further include a protective layer. The protective layer may be provided on the upper surface of the light emitting structure 623. Further, the protective layer may be provided on a side surface of the light emitting structure 623. The protective layer may be provided so that the first bonding portion 621 and the second bonding portion 622 are exposed. In addition, the protective layer may be selectively provided on the periphery and the lower surface of the substrate 624. By way of example, the protective layer may be provided as an insulating material. For example, the protective layer may be formed of at least one material selected from the group consisting of $Si_xO_y$, $SiO_xN_y$, $Si_xN_y$, or $Al_xO_y$.

In the light emitting device according to the embodiment, light generated in the active layer 623b may be emitted in six side directions of the light emitting device. The light generated in the active layer 623b may be emitted in the six side directions through the upper surface, lower surfaces and four side surfaces of the light emitting device.

As another example of the light emitting device, at least one of the first electrode and the second electrode may be implemented in a pattern shape, and a conductive protruding portion that may be inserted into the through hole may be disposed in the electrode of the pattern shape. The pattern may include a pattern having one or a plurality of arcs or branches. Or a conductive protruding portion may be disposed on each bonding portion of the light emitting device. The light emitting device has been described as having a single light emitting cell. When the light emitting cell includes the light emitting structure, the driving voltage of the light emitting device may be a voltage applied to one light emitting cell. As an example of the light emitting device disclosed in the embodiment, a light emitting device having two light emitting cells may be disclosed.

As described above, the bonding portion of the light emitting device according to the embodiment may receive driving power through the metal portion and the conductive portion disposed in the through hole. The melting point of the conductive portion disposed in the through hole may be selected to have a higher value than the melting point of the general bonding material. Therefore, the light emitting device package according to the embodiment does not cause a re-melting phenomenon even when it is bonded to a circuit board through a reflow process, thereby preventing the electrical connection and the physical bonding force from being deteriorated have. The light emitting device package according to the embodiment may be applied to a light source device. Further, the light source device may include a display device, a lighting device, a head lamp, and the like depending on an industrial field. An example of the light source device includes a bottom cover, a reflector disposed on the bottom cover, a light emitting module that emits light and includes a light emitting device, a light guide plate disposed in front of the reflector and guided in front the light emitting from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of to the display panel. Here, the bottom cover, the reflector, the light emitting module, the light guide plate, and the optical sheet may form a backlight unit. The display device may have a structure in which light emitting devices emitting red, green, and blue light are disposed, respectively, without including a color filter.

As another example of the light source device, the headlamp may be embodied as a light emitting module or a light module including a light emitting device package disposed on a substrate, and may include a reflector for reflecting the light emitted from the light emitting module or the light module in a predetermined direction, for example, forward, a lens for refracting the light reflected by the reflector forward, and a shade that blocks or reflects a portion of the light distribution pattern to achieve a desired light distribution pattern by the designer. The lighting device, which is another example of the light source device, may include a cover, a light source module, a heat sink, a power supply, an inner case, and a socket. Further, the light source device according to the embodiment may further include at least one of a member and a holder. The light source module may include the light emitting device package according to the embodiment.

The characteristics, structures and effects described in the above-described embodiments are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modified example are included in the scope of the invention.

In addition, embodiments are mostly described above. However, they are only examples and do not limit the invention. A person skilled in the art may appreciate that several variations and applications not presented above may be made without departing from the essential characteristics of the embodiments. For example, each component particularly represented in the embodiments may be varied. In addition, it should be construed that differences related to such a variation and such an application are included in the scope of the invention defined in the following claims.

What is claimed is:

1. A light emitting device package comprising:
a body including an upper surface and a lower surface, the body including a first recess and a second recess concaved from the lower surface toward the upper surface;
a light emitting device disposed on the body and including a first bonding portion and a second bonding portion; and
first and second conductive portions respectively disposed in the first recess and the second recess,
wherein the body includes a first through hole and a second through hole penetrating an upper surface of each of the first recess and the second recess and the upper surface of the body,
wherein each of the first through hole and the second through hole comprises a first inner surface having a first angle of inclination and a second inner surface having a second angle of inclination, the second angle of inclination being different than the first angle of inclination, and
wherein each of the first and second conductive portions extends into the first and second through holes and is electrically connected to the first bonding portion and the second bonding portion, respectively.

2. The light emitting device package of claim 1, wherein each of the first and second conductive portions comprise a resin and a metal, and
wherein each of the first and second conductive portions have a wt % of the metal being higher than a wt % of the resin.

3. The light emitting device package of claim 2, wherein the wt % of the metal in the each of the first and second conductive portions is a 70 wt % or more, and the wt % of the resin is a 10 wt % or more, and
wherein the first and second conductive portions are in contact with a surface of the body in the first and second through holes.

4. The light emitting device package of claim 2, wherein the resin of the first and second conductive portions comprises an amine-based resin adhesive or an epoxy-based resin adhesive.

5. The light emitting device package of claim 2, further comprising:
   first and second metal portions disposed in the first and second through holes, respectively,
   wherein the wt % of the metal in the first and second conductive portions is a 50 wt % or more, the wt % of the resin is a 25 wt % or more, and
   wherein the first and second conductive portions are not in contact with a surface of the body in the first and second through holes, respectively.

6. The light emitting device package of claim 5, wherein the first metal portion is in contact with the first bonding portion disposed on an upper surface of the first through hole, and
   wherein the second metal portion is in contact with the second bonding portion disposed on an upper surface of the second through hole.

7. The light emitting device package of claim 5, wherein the first and second metal portions is disposed in the first and second recesses, respectively,
   wherein the first and second recesses are disposed on an outer side of the first and second through holes, respectively,
   wherein extension portions of the first and second conductive portions are extended to the first and second recesses, respectively, and
   wherein the first and second metal portions have a thickness smaller than a depth of the first and second recesses.

8. The light emitting device package of claim 1, wherein the first through hole is disposed on a portion of the first recess,
   wherein the second through hole is disposed on a portion of the second recess,
   wherein extension portions of the first and second conductive portions are extended to the first and second recesses,
   wherein an area of a lower surface of the first through hole is smaller than an area of a lower surface of the first recess, and
   wherein an area of a lower surface of the second through hole is smaller than an area of a lower surface of the second recess.

9. The light emitting device package of claim 1, wherein inner side surfaces of the first and second through holes include at least one protruding portion protruding toward a center of the first and second through holes, respectively.

10. The light emitting device package of claim 1, further comprising:
    a cavity in the body, the cavity having the light emitting device;
    a molding part in the cavity; and
    a first resin between at least one of a lower surface and a periphery of the light emitting device and a bottom surface of the cavity.

11. A light source unit comprising:
    a circuit board including first and second pads; and
    at least one light emitting device packages are disposed on the pads of the circuit board,
    wherein the light emitting device package is the light emitting device package according to claim 1.

12. A light emitting device package comprising:
    a body including an upper surface, a lower surface, and a cavity, the body including a first through hole and a second through hole penetrating from a bottom surface of the cavity toward the lower surface of the body;
    a light emitting device disposed in the cavity and including a first bonding portion and a second bonding portion;
    a first resin disposed in the cavity and adhered to the light emitting device;
    a first conductive portion disposed in the first through hole;
    a second conductive portion disposed in the second through hole;
    a first metal portion disposed in the first through hole; and
    a second metal portion disposed in the second through hole,
    wherein the first metal portion is disposed around the first conductive portion disposed in the first through hole,
    wherein the second metal portion is disposed around the second conductive portion disposed in the second through hole,
    wherein each of the first and second metal portions is in contact with the surfaces of the first and second through holes, respectively,
    wherein an upper surface of the first metal portion is disposed on a same plane as the bottom surface of the cavity and an upper surface of the second metal portion is disposed on the same plane as the bottom surface of the cavity, wherein the body includes a first recess and a second recess concaved from the lower surface of the body toward the bottom surface of the cavity,
    wherein each of the first and second bonding portions is electrically connected to each of the first and second conductive portions,
    wherein each of the first and second conductive portions is exposed on the lower surface of the body, and
    wherein the first and second conductive portions comprise a resin and a metal.

13. The light emitting device package of claim 12, wherein the first and second conductive portions have a wt % of the metal greater than a wt % of the resin.

14. The light emitting device package of claim 13, wherein the wt % of the metal in the first and second conductive portions is a 70 wt % or more, and the wt % of the resin is a 10 wt % or more, and
    wherein the resin of the first and second conductive portions comprises an amine-based resin adhesive or an epoxy-based resin adhesive.

15. The light emitting device package of claim 12, wherein each of the first and second conductive portions are not in contact with the surfaces of the first and second through holes, respectively.

16. The light emitting device package of claim 12, wherein the first metal portion is connected to the first bonding portion disposed on an upper surface of the first through hole, and
    wherein the second metal portion is connected to the second bonding portion disposed on an upper surface of the second through hole.

17. The light emitting device package of claim 12, wherein a depth of the first and second recesses is smaller than a depth of the first and second through holes,
    wherein a lower portion of the first through hole is disposed on the first recess, and
    wherein a lower portion of the second through hole is disposed on the second recess.

18. The light emitting device package of claim 17, wherein a portion of the first conductive portion is disposed in the first recess, and a portion of the second conductive portion is disposed in the second recess.

19. The light emitting device package of claim 12, wherein the first recess is disposed on an outer side of the first through hole,
- wherein the second recess is disposed on an outer side of the second through hole,
- wherein the first metal portion is disposed on a surface of the first recess, and
- wherein the second metal portion is disposed on a surface of the second recess.

20. The light emitting device package of claim 12, wherein a lower surface of the first metal portion does not extend beyond the lower surface of the body and a lower surface of the second metal portion does not extend beyond the lower surface of the body.

* * * * *